(12) United States Patent
Seo et al.

(10) Patent No.: US 7,443,457 B2
(45) Date of Patent: Oct. 28, 2008

(54) LIQUID CRYSTAL DISPLAY DEVICE HAVING POLYCRYSTALLINE SILICON THIN FILM TRANSISTOR AND METHOD OF FABRICATING THE SAME

(75) Inventors: Hyun-Sik Seo, Annyang-si (KR); Young-Joo Kim, Ubang Oseong town (KR); Sang-Hyun Kim, Annyang-si (KR)

(73) Assignee: LG Display Co., Ltd., Seoul (KR)

( * ) Notice: Subject to any disclaimer, the term of this patent is extended or adjusted under 35 U.S.C. 154(b) by 502 days.

(21) Appl. No.: 10/865,790

(22) Filed: Jun. 14, 2004

(65) Prior Publication Data
US 2004/0263705 A1 Dec. 30, 2004

(30) Foreign Application Priority Data
Jun. 25, 2003 (KR) ...................... 10-2003-0041699
Jun. 25, 2003 (KR) ...................... 10-2003-0041700

(51) Int. Cl.
*G02F 1/136* (2006.01)

(52) U.S. Cl. .............................. 349/43; 349/42; 349/46; 349/47

(58) Field of Classification Search .................. 349/43, 349/42, 46, 47
See application file for complete search history.

(56) References Cited
U.S. PATENT DOCUMENTS 6,322,625 B2   11/2001  Im
6,368,945 B1    4/2002  Im
6,542,205 B2 *  4/2003  Ohtani et al. ................. 349/47
6,566,173 B1 *  5/2003  Choi ............................ 438/149
6,713,825 B2 *  3/2004  Hwang ........................ 257/408
2003/0020851 A1  1/2003  Kim et al.
2004/0041158 A1  3/2004  Hongo et al.

FOREIGN PATENT DOCUMENTS

| EP | 1 067 593 | 1/2001 |
| EP | 1 102 111 | 5/2001 |
| JP | 05021343 A | 1/1993 |
| JP | 10-12891 | 1/1998 |
| JP | 20021-148480 | 5/2001 |
| JP | 2003-124116 | 4/2003 |

\* cited by examiner

*Primary Examiner*—David C. Nelms
*Assistant Examiner*—Thanh-Nhan P Nguyen
(74) *Attorney, Agent, or Firm*—McKenna Long & Aldridge LLP

(57) ABSTRACT

A method of fabricating an array substrate for a liquid crystal display device includes forming an alignment key on a substrate having a display region and a non-display region surrounding the display region; forming an amorphous silicon layer on the alignment key; crystallizing a predetermined portion of the amorphous silicon layer using the alignment key as a reference; patterning the amorphous silicon layer using the alignment key as a reference to form a polycrystalline silicon layer, the polycrystalline silicon layer being formed from the predetermined portion of the amorphous silicon layer; forming a gate insulating layer on the semiconductor layer; forming a gate electrode on the gate insulating layer using the alignment key as a reference; forming an interlayer insulating layer on the gate electrode; and forming source and drain electrodes on the interlayer insulating layer.

16 Claims, 29 Drawing Sheets

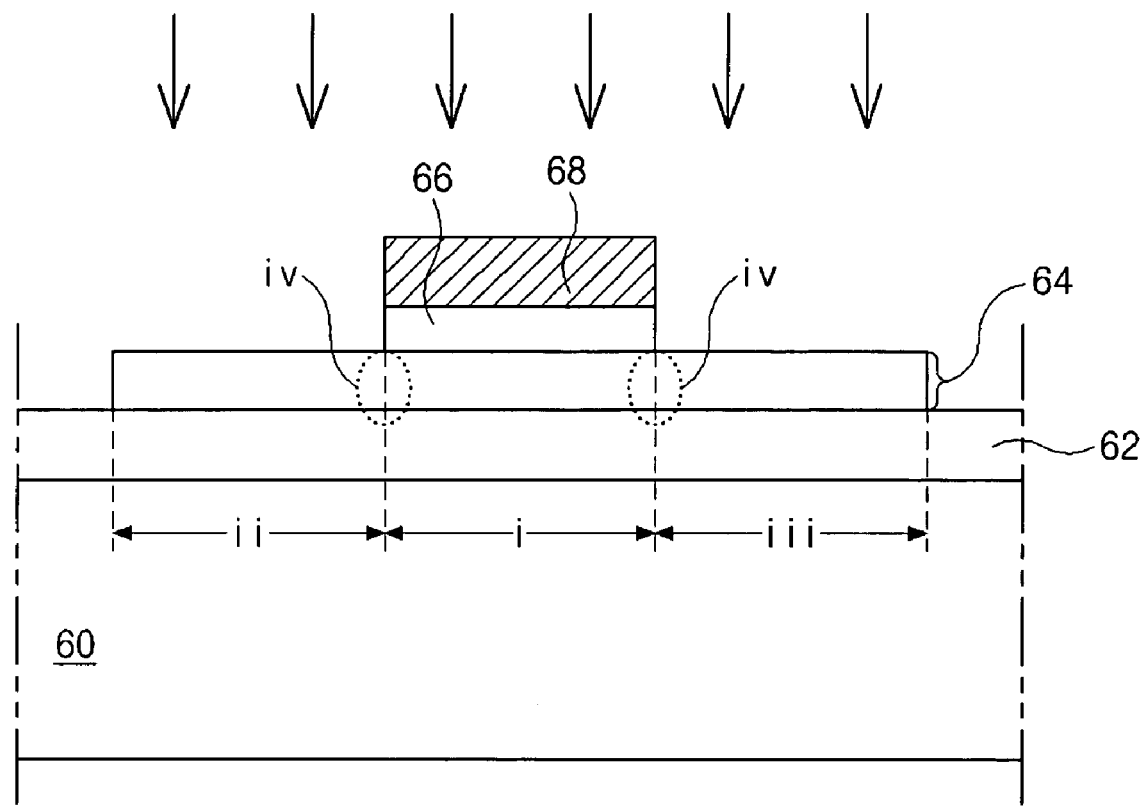

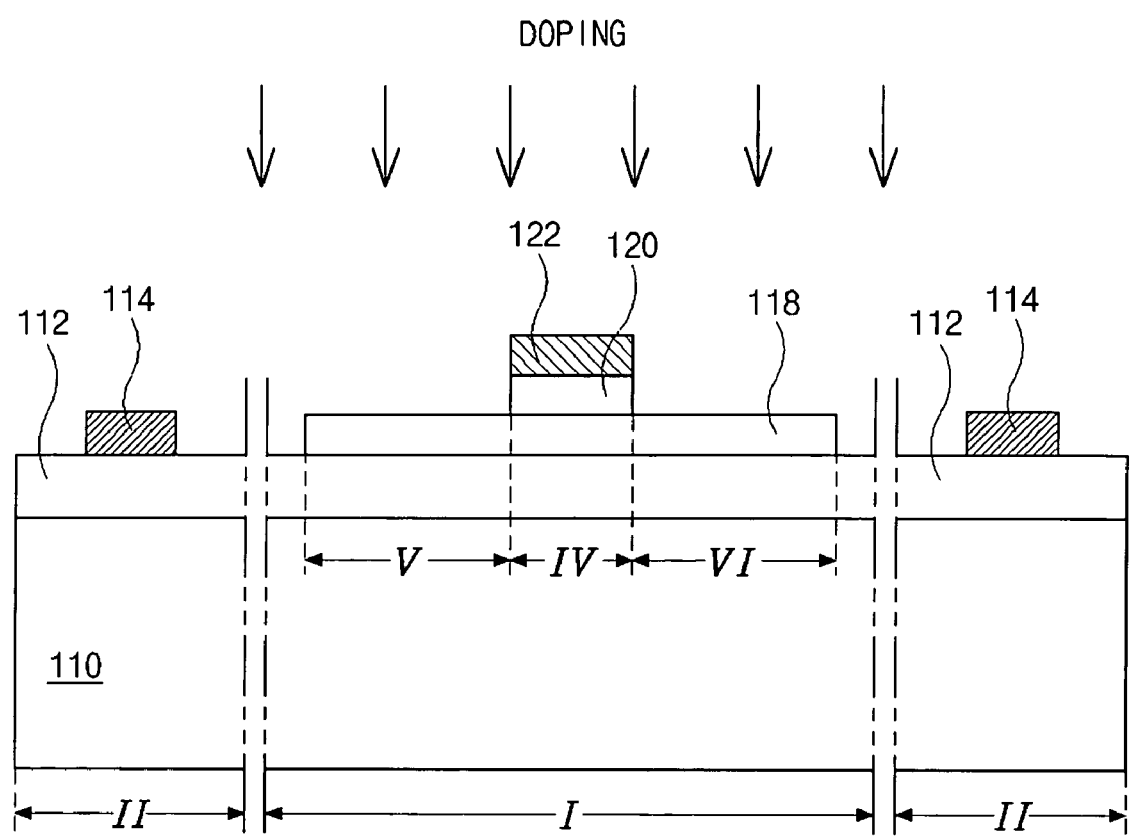

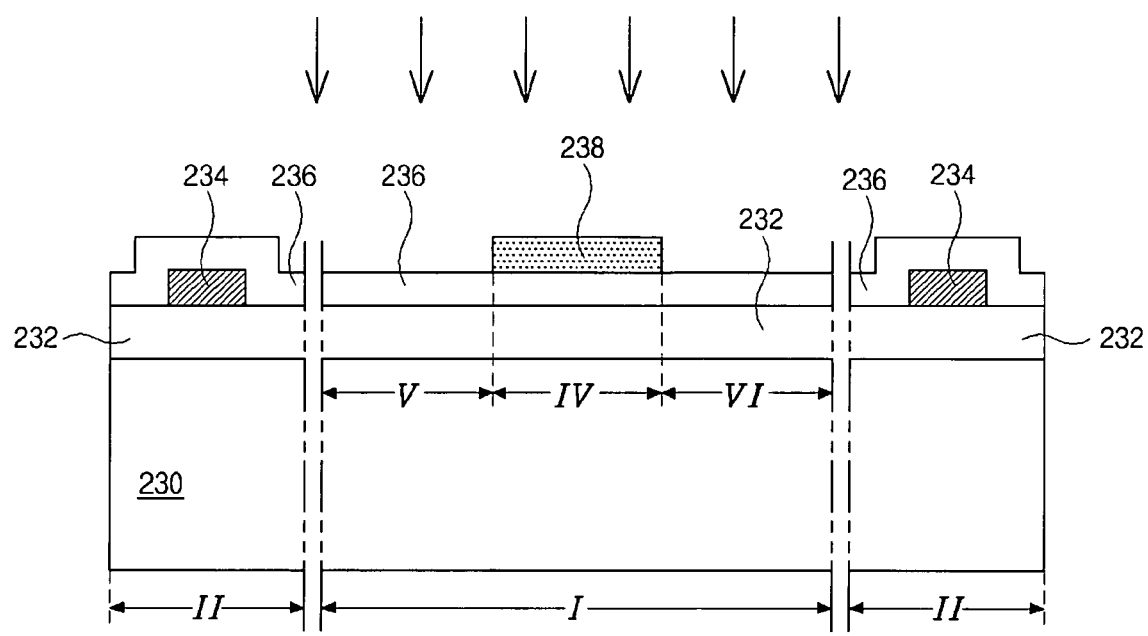

CRYSTALLIZATION

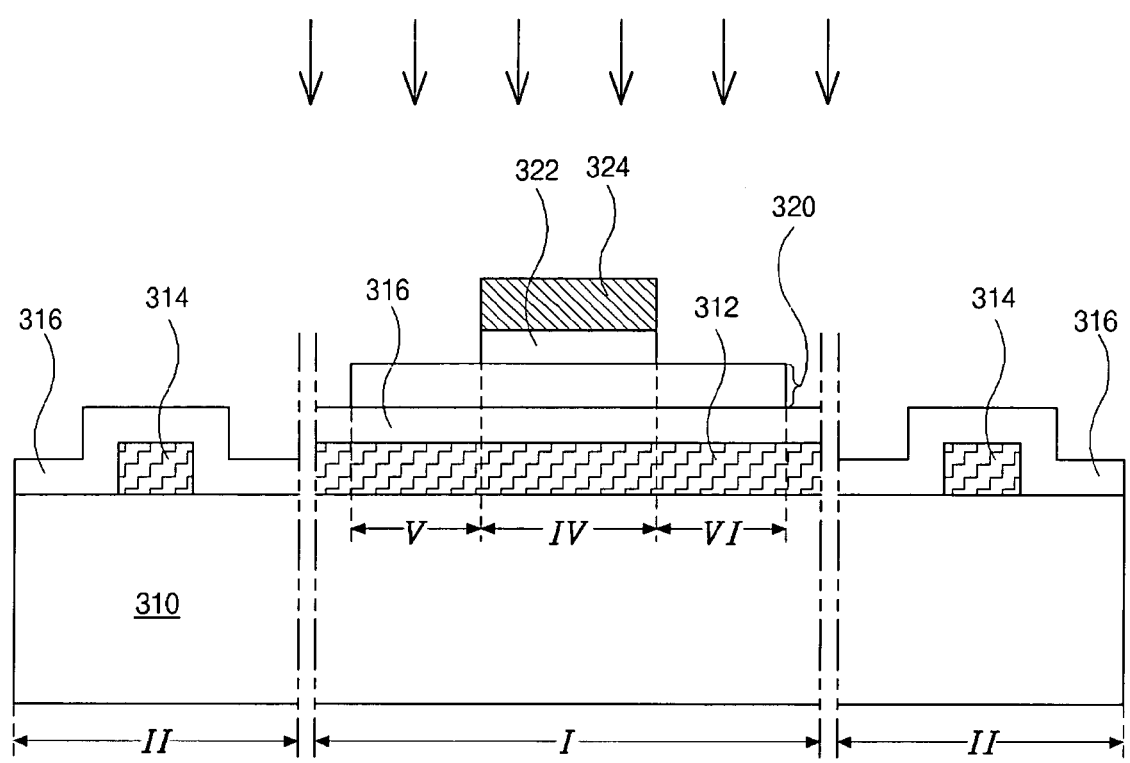

CRYSTALLIZATION & ACTIVATION

LIQUID CRYSTAL DISPLAY DEVICE HAVING POLYCRYSTALLINE SILICON THIN FILM TRANSISTOR AND METHOD OF FABRICATING THE SAME

This application claims the benefit of Korean Patent Applications No. 2003-41699, filed in Korea on Jun. 25, 2003 and No. 2003-41700, filed in Korea on Jun. 25, 2003, which are hereby incorporated by reference for all purposes as if fully set forth herein.

BACKGROUND OF THE INVENTION

1. Field of the Invention

The present invention relates to liquid crystal display (LCD) devices. More particularly, the present invention relates to LCD devices having polycrystalline thin film transistors (TFTs) and methods of fabricating the same.

2. Discussion of the Related Art

Due to their high portability and low power consumption, flat panel display (FPD) devices have been the subject of recent research. Among the various types of FPD devices, LCD devices are widely used as monitors for notebook and desktop computers because of their ability to display high resolution images, colors, and moving images.

Generally, an LCD device includes two substrates separated from each other by a liquid crystal layer, wherein each substrate supports electrodes, and wherein electrodes supports electrodes that disposed such that respective electrodes of the two substrates face into each other. When a voltage is applied to the electrodes, an electric field is generated which affects the orientation of liquid crystal molecules within the liquid crystal layer. Consequently, light transmittance characteristics of the liquid crystal layer become modulated and images are displayed by the LCD device.

Active matrix-type LCD devices include a plurality of pixel regions arranged in a matrix pattern, wherein each pixel region includes a switching element such as a TFT. Due to their composition, active-matrix LCDs are able to display high quality moving images. TFTs of such LCD devices may be formed using polycrystalline silicon (i.e., polycrystalline type TFTs) or amorphous silicon (i.e., a-Si type TFTs). Driving circuits of LCD devices incorporating polycrystalline silicon type TFTs can beneficially be formed on the same substrate as TFTs within the pixel regions and the necessity of additional processes to connect the TFTs of the pixel regions with driving circuits may be eliminated. Because polycrystalline silicon has a field effect mobility greater than that of amorphous silicon, LCD devices incorporating polycrystalline type TFTs beneficially include driving integrated circuits (ICs) and array elements (i.e., TFTs within the pixel regions) formed on the same substrate. Accordingly, the material cost for the driving ICs is reduced and the process of fabricating the LCD devices is simplified. Further, because polycrystalline silicon has a field effect mobility than a-Si, LCD devices incorporating polycrystalline silicon type TFTs have faster response times and increased resistance to the deleterious effects of heat and light.

Polycrystalline silicon can be formed by crystallizing amorphous silicon. One related art process of crystallizing amorphous silicon employs a laser annealing method, whereby a laser beam is irradiated onto the surface of an amorphous silicon film to generate temperatures of about 1400° C. At such temperatures, however, the irradiated surface of the amorphous silicon film oxidizes. Accordingly, where the laser annealing occurs in an oxygen containing environment while a laser beam is repeatedly irradiated onto the surface of the amorphous silicon film, silicon oxide ($SiO_2$) is formed on the irradiated surface. Therefore, the laser annealing process must be performed in a vacuum of about $10^{-7}$ to $10^{-6}$ Torr to prevent formation of the silicon oxide. While, the above-described laser annealing method produces polycrystalline silicon having very large grains, the area of the grain boundaries in the polycrystalline produced is also very large, which can contribute to the unacceptable generation of leakage currents.

In order to solve problems of the above-described laser annealing method, a sequential lateral solidification (SLS) method has been provided. The SLS method leverages the natural tendency of silicon grains to grow along a direction perpendicular to a phase boundary between of a liquid phase region and a solid phase region. Accordingly, the lateral growth of silicon grains may be controlled by adjusting an energy density, an irradiation range, and motion of a laser beam. (Robert S. Sposilli, M. A. Crowder, and James S. Im, Mat. Res. Soc. Symp. Proc. Vol. 452, 956–057, 1997) By controlling growth of the silicon grains as described above, the area of the grain boundaries may be minimized, thereby minimizing the generation of leakage current.

FIG. 1 illustrates a schematic view of a related art LCD device including a driving circuit and array elements arranged on the same substrate.

Referring to FIG. 1, a substrate 2 supports a centrally arranged pixel area 4 and a driving circuit area 3 arranged at a periphery of the pixel area 4. The driving circuit area 3 includes a gate driving circuit 3a and a data driving circuit 3b arranged at left and top portions of the pixel area 4, respectively. The pixel area 4 includes a plurality of gate lines 6 connected to the gate driving circuit 3a, a plurality of data lines 8 connected to the data driving circuit 3b and crossing the plurality of gate lines 6 to define pixel regions, a plurality of pixel electrodes 10 arranged within the plurality of pixel regions, and a plurality of TFTs "T" to the pixel electrodes 10.

The gate and data driving circuits 3a and 3b, respectively, are connected to an input terminal of an external signal, adjust the external signal, and supply the adjusted signals to the pixel electrodes 10. Specifically, the gate driving circuit 3a supplies scan signals to the pixel electrodes 10 via the gate lines 6 and the data driving circuit 3b supplies data signals to the pixel electrodes 10 via the data lines 8. The gate and data driving circuits 3a and 3b consist of a plurality of polycrystalline silicon type TFTs formed by crystallizing amorphous silicon via an SLS method.

FIG. 2A illustrates a schematic view of a related art mask used in a sequential lateral solidification method. FIG. 2B illustrates a schematic view of a silicon layer crystallized using the related art mask of FIG. 2A.

Referring to FIG. 2A, the related art mask 14 includes a slit pattern 12 several micrometers (e.g., about 2 μm to about 3 μm) wide. Accordingly, a laser beam several micrometers wide may be irradiated onto the surface of a silicon layer. While not shown in FIG. 2A, the related art mask 14 may include a plurality of slit patterns 12 spaced apart from each other by several micrometers.

Referring to FIG. 2B, a laser beam (not shown) is irradiated through the slit pattern 12 in mask 14 shown in FIG. 2A and onto the surface of an amorphous silicon layer 20. Region 22 illustrates the irradiated portion of the amorphous silicon layer 20. Upon being irradiated by the laser beam, region 22 the amorphous silicon layer 20 becomes completely molten and subsequently cools to form grains 24a and 24b. Accordingly, region 22 may be referred to as a unit crystallization area. During cooling of the molten amorphous silicon material, grains 24a and 24b grow laterally away from opposing ends of the unit crystallization area 22 toward a central portion of the unit crystallization area 22. Accordingly, a grain boundary 28b is formed where the grains 24a and 24b meet in the central portion of the unit crystallization area 22. An entirety of the amorphous silicon layer 20 may be fully crystallized by repeating the irradiation process described above onto other surfaces of the amorphous silicon layer 20.

FIG. 3 illustrates a schematic view of a polycrystalline silicon layer formed in accordance with a related art sequential lateral solidification method.

Referring to FIG. 3, a polycrystalline silicon layer formed by the aforementioned related art SLS method generally includes a plurality of unit crystallization areas 30 and first and second overlapping areas 40 and 50 (i.e., areas of the silicon layer that were repeatedly irradiated with the laser beam). The first overlapping area 40 is arranged between transversally adjacent unit crystallization areas 30 and the second overlapping area 50 is arranged between longitudinally adjacent unit crystallization areas 30. Because the first and second overlapping areas 40 and 50 are irradiated several times, the crystallinity of the polycrystalline silicon material found within the first and second overlapping areas 40 and 50 is non-uniform. When TFTs of the pixel regions include polycrystalline silicon having non-uniform crystallinity, the display quality of the LCD device is degraded.

FIGS. 4A to 4D illustrate schematic cross-sectional views of a related art process of fabricating a polycrystalline silicon type TFT.

Referring to FIG. 4A, a buffer layer 62 is formed on a substrate 60 and a polycrystalline silicon layer 64 is formed on the buffer layer 62. The polycrystalline silicon layer is obtained by an crystallizing amorphous silicon layer as described above.

Referring to FIG. 4B, a gate insulating layer 66 and a gate electrode 68 are sequentially formed on the polycrystalline silicon layer 64.

Referring to FIG. 4C, the polycrystalline silicon layer 64 is doped with impurities using the gate electrode 68 as a doping mask. Accordingly, the polycrystalline silicon layer 64 includes a channel region "i" defined by source and drain regions "ii" and "iii" formed at opposing sides thereof, wherein the portion of the polycrystalline silicon layer 64 in the channel region "i" does not include impurities, and wherein the portions of the polycrystalline silicon layer 64 in the source and drain regions "ii" and "iii" include impurities.

Referring to FIG. 4D, portions of the polycrystalline silicon layer 64 in the source and drain regions "ii" and "iii" are "activated" in a heat treatment. Specifically, impurities introduced into the polycrystalline silicon layer 64 during the doping process outlined in FIG. 4C cause portions of the polycrystalline silicon layer 64 in the source and drain regions "ii" and "iii" become amorphized. Consequently, the impurities cannot adequately function as charge carriers for the subsequently formed TFT. Accordingly, the "activating" heat treatment consisting of a laser annealing method is performed to re-crystallize the amorphized portions of the polycrystalline silicon layer 64 and allow the impurities to adequately function as charge carriers.

Referring back to FIG. 4C, the source and drain regions "ii" and "iii" are formed in a self-aligning process (i.e., the structure of the device itself—the gate electrode 68—is used as a dopant mask, obviating the need for additional dopant masks). Thus, the TFT fabricated using the doping process outlined in FIG. 4C is referred to as a self-aligned TFT.

While obviating the need for additional dopant masks, the related art TFTs fabrication method shown in FIGS. 2A-2D, however, undesirably requires the activation step that re-crystallizes amorphized, previously crystallized silicon material. Moreover, because the gate electrode 68 is used as the doping mask and the polycrystalline silicon layer 64 is activated with the gate electrode 68 formed thereon, the polycrystalline silicon layer 64 contains a junction region "iv" aligned with edges of the gate electrode 68 that has a poor crystallinity which can promote undesirable leakage current and degrade the electrical characteristics of the TFT.

SUMMARY OF THE INVENTION

Accordingly, the present invention is directed to an LCD device having a polycrystalline silicon type TFT and a method of fabricating the same that substantially obviates one or more of the problems due to limitations and disadvantages of the related art.

An advantage of the present invention provides method of crystallizing a silicon layer to form a grain boundary that is precisely positioned using an alignment key.

Another advantage of the present invention provides a polycrystalline silicon type TFT formed using alignment keys and a fabricating method the same, wherein the polycrystalline silicon type TFT has a uniform crystallinity.

Another advantage of the present invention provides an LCD device having a grain boundary and an active layer are formed using an alignment key.

Another advantage of the present invention provides an LCD device and a method of fabricating the same, where an amorphous silicon layer is crystallized and an active layer is formed using an alignment key of the same material as a color filter layer under a thin film transistor.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating an array substrate of an LCD device may, for example, include forming an alignment key on a substrate having a display region and a non-display region surrounding the display region; forming an amorphous silicon layer on the alignment key; crystallizing a predetermined portion of the amorphous silicon layer using the alignment key as a reference; patterning the amorphous silicon layer using the alignment key as a reference to form a polycrystalline silicon layer, wherein the polycrystalline silicon layer is formed from the predetermined portion of the amorphous silicon layer; forming a gate insulating layer on the polycrystalline silicon layer; forming a gate electrode on the gate insulating layer using the alignment key as a reference; forming an interlayer insulating layer on the gate electrode; and forming source and drain electrodes on the interlayer insulating layer.

In another aspect of the present invention, a method of fabricating an array substrate of an LCD device may, for example, include forming an alignment key on a substrate having a display region and a non-display region surrounding the display region; forming an amorphous silicon layer on the alignment key; forming a dummy pattern on the amorphous silicon layer, wherein the dummy pattern is formed using the alignment key as a reference; doping the amorphous silicon layer with impurities using the dummy pattern as a doping mask; removing the dummy pattern; crystallizing a predetermined portion of the amorphous silicon layer using the alignment key as a reference; patterning the amorphous silicon layer using the alignment key as a reference to form a polycrystalline silicon layer, wherein the polycrystalline silicon layer is formed from the predetermined portion of the amorphous silicon layer; forming a gate insulating layer on the polycrystalline silicon layer; forming a gate electrode on the gate insulating layer using the alignment key as a reference, wherein the gate electrode corresponds to the dummy pattern; forming an interlayer insulating layer on the gate electrode; and forming source and drain electrodes on the interlayer insulating layer.

In still another aspect of the present invention, a method of crystallizing an amorphous silicon may, for example, include forming an alignment key on a substrate; forming an amorphous silicon layer on the alignment key; and crystallizing a predetermined portion of the amorphous silicon layer using the alignment key as a reference.

In yet another aspect of the present invention, a method of fabricating an LCD device may, for example, include forming an alignment key on a first substrate having a display region and a non-display region surrounding the display region; forming an amorphous silicon layer on the alignment key; crystallizing a predetermined portion of the amorphous silicon layer using the alignment key as a reference; patterning the amorphous silicon layer using the alignment key as a reference to form a polycrystalline silicon layer, wherein the polycrystalline silicon layer is formed from the predetermined portion of the amorphous silicon layer; forming a gate insulating layer on the polycrystalline silicon layer; forming a gate electrode on the gate insulating layer using the alignment key as a reference; forming an interlayer insulating layer on the gate electrode; forming source and drain electrodes on the interlayer insulating layer; forming a passivation layer on the source and drain electrodes; forming a pixel electrode on the passivation layer; forming a common electrode on a second substrate; attaching the first and second substrates such that the pixel electrode faces the common electrode; and forming a liquid crystal layer between the pixel electrode and the common electrode.

In still a further aspect of the present invention, a method of fabricating an LCD device may, for example, include forming an alignment key on a substrate having a display region and a non-display region surrounding the display region; forming an amorphous silicon layer on the alignment key; forming a dummy pattern on the amorphous silicon layer, wherein the dummy pattern is formed using the alignment key as a reference; doping the amorphous silicon layer with impurities using the dummy pattern as a doping mask; removing the dummy pattern; crystallizing a predetermined portion of the amorphous silicon layer using the alignment key as a reference; patterning the amorphous silicon layer using the alignment key as a reference to form a polycrystalline silicon layer, wherein the polycrystalline silicon layer is formed from the predetermined portion of the amorphous silicon layer; forming a gate insulating layer on the polycrystalline silicon layer; forming a gate electrode on the gate insulating layer using the alignment key as a reference, wherein the gate electrode corresponds to the dummy pattern; forming an interlayer insulating layer on the gate electrode; forming source and drain electrodes on the interlayer insulating layer; forming a passivation layer on the source and drain electrodes; forming a pixel electrode on the passivation layer; forming a common electrode on a second substrate; attaching the first and second substrates such that the pixel electrode faces the common electrode; and forming a liquid crystal layer between the pixel electrode and the common electrode.

In yet another aspect of the present invention, an array substrate for an LCD device may, for example, include a substrate having a display region and a non-display region surrounding the display region; an alignment key and a color filter layer on the substrate, wherein the alignment key and the color filter layer are arranged within the non-display region and the display region, respectively; a buffer layer on the alignment key and the color filter layer; a polycrystalline silicon layer on the buffer layer, wherein the polycrystalline silicon layer includes a channel region, a source region, and a drain region defined using the alignment key as a reference; a gate insulating layer on the polycrystalline silicon layer; a gate electrode on the gate insulating layer, wherein the gate electrode corresponds to the channel region using the alignment key as a reference; an interlayer insulating layer on the gate electrode; and source and drain electrodes on the interlayer insulating layer.

In still another aspect of the present invention, an LCD device may, for example, include first and second substrates having a display region and a non-display region surrounding the display region, wherein the first and second substrates face each other and are spaced apart from each other; an alignment key and a color filter layer on the first substrate, wherein the alignment key and color filter layer are arranged within the non-display region and the display region, respectively; a buffer layer on the alignment key and the color filter layer; a polycrystalline silicon layer on the buffer layer, wherein the polycrystalline silicon layer includes a channel region, a source region and a drain region defined using the alignment key as a reference; a gate insulating layer on the polycrystalline silicon layer; a gate electrode on the gate insulating layer, wherein the gate electrode corresponds to the channel region using the alignment key as a reference; an interlayer insulating layer on the gate electrode; source and drain electrodes on the interlayer insulating layer; a passivation layer on the source and drain electrodes; a pixel electrode on the passivation layer; a common electrode on the second substrate; and a liquid crystal layer between the pixel electrode and the common electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 4A to 4D illustrate schematic cross-sectional views of a related art process of fabricating a polycrystalline silicon type TFT;

FIGS. 5A to 5H illustrate schematic cross-sectional views of a process of fabricating a TFT according to a first embodiment of the present invention;

FIGS. 6A to 6G illustrate schematic cross-sectional views of a process of fabricating a TFT according to a second embodiment of the present invention;

FIGS. 7A to 7H illustrate schematic cross-sectional views of a process of fabricating a TFT according to a third embodiment of the present invention;

DETAILED DESCRIPTION OF THE ILLUSTRATED EMBODIMENTS

Reference will now be made in detail to embodiments of the present invention, examples of which are illustrated in the accompanying drawings.

As will be described in greater detail below, the principles of the present invention contemplate performing many types fabrication processes including, for example, laser beam irradiation, ion implantation, etching, etc., that involve processing, for example, one area of an object to be processed but not another. Accordingly, such processes inherently involve the necessity to align the object being processed with an apparatus capable of performing the process. The alignment keys of the present invention, as will be discussed in greater detail below, are thus used as references to facilitate the alignment between the object being processed and the apparatus capable of performing the process.

FIGS. 5A to 5H illustrate schematic cross-sectional views of a process of fabricating a polycrystalline silicon type TFT according to a first embodiment of the present invention.

Figure 1:
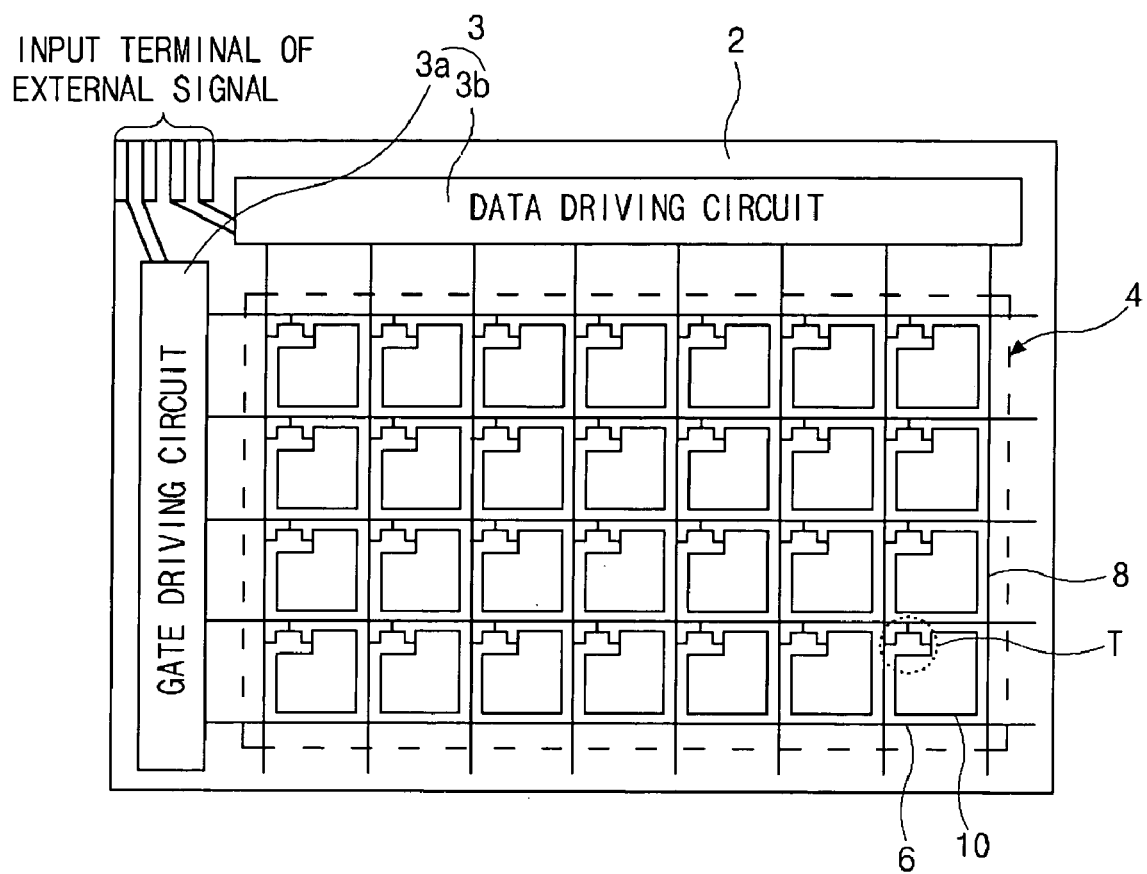
FIG. 1 illustrates a schematic view of a related art LCD device including a driving circuit and array elements arranged on the same substrate.
Figure 2A:
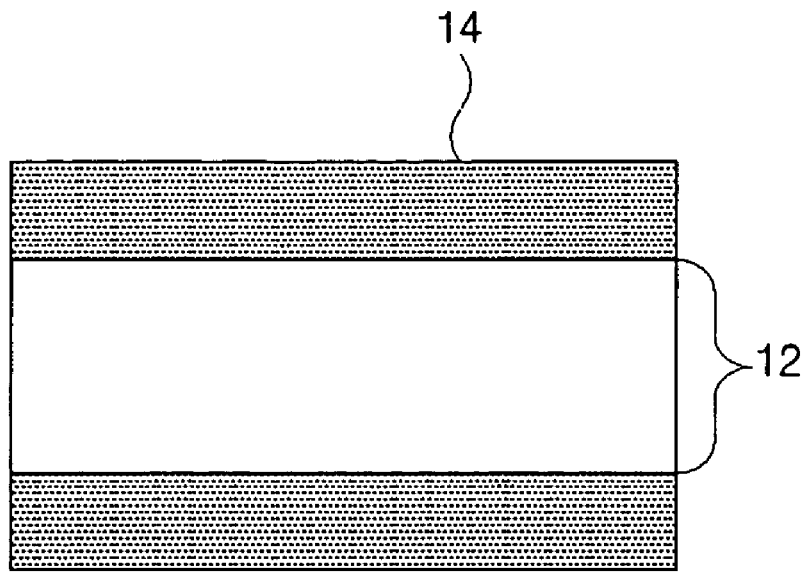
FIG. 2A illustrates a schematic view of a related art mask used in a sequential lateral solidification method.
Figure 2B:
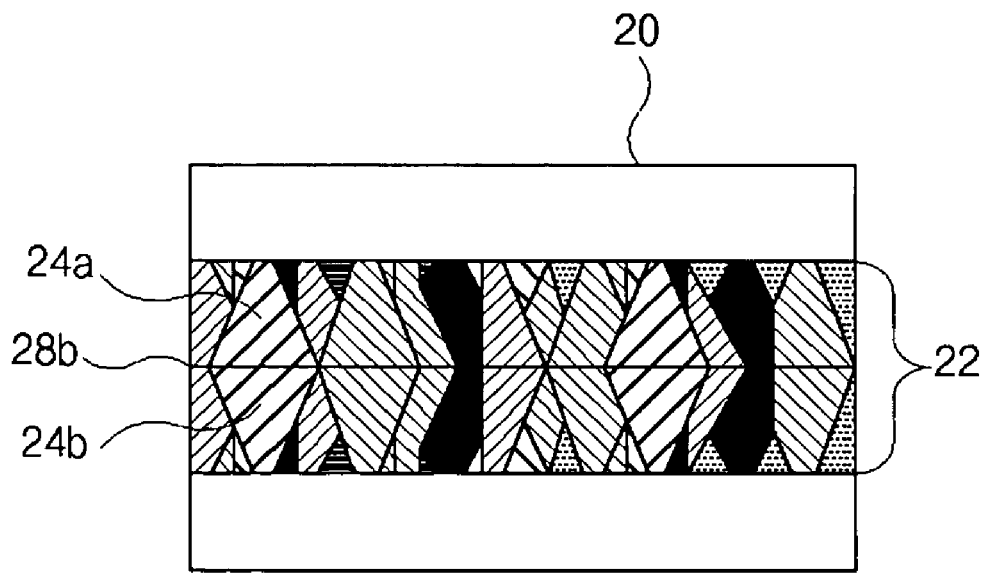
FIG. 2B illustrates a schematic view of a silicon layer crystallized using the related art mask of FIG. 2A.
Figure 3:
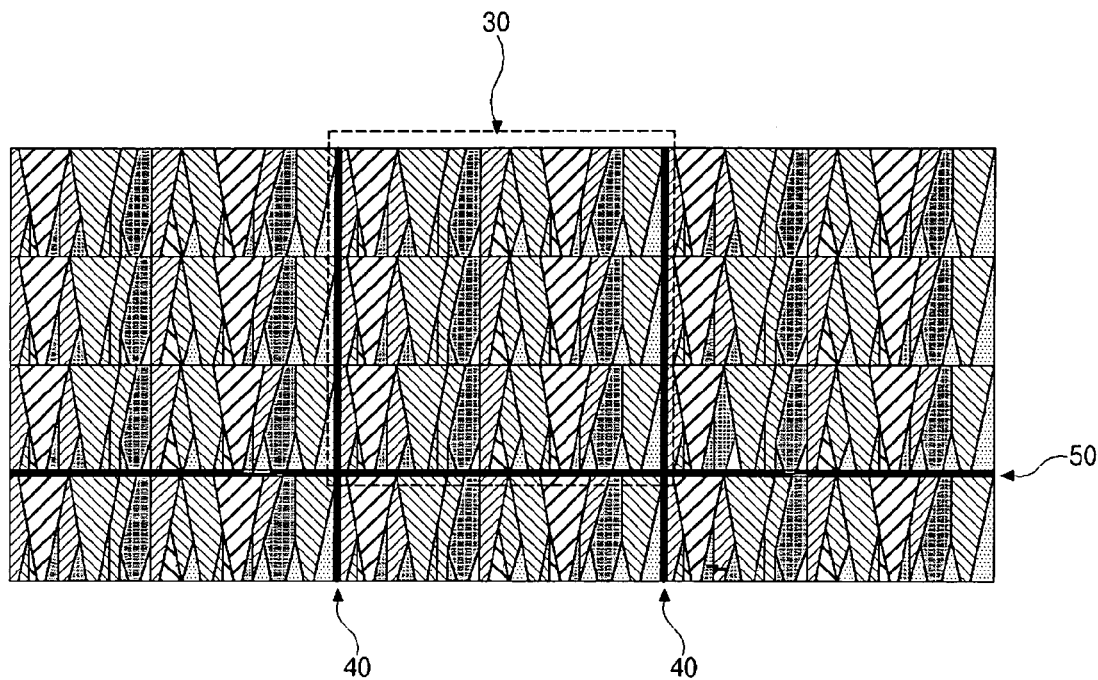
FIG. 3 illustrates a schematic view of a polycrystalline silicon layer crystallized by a related art sequential lateral solidification method.
Figure 4A:
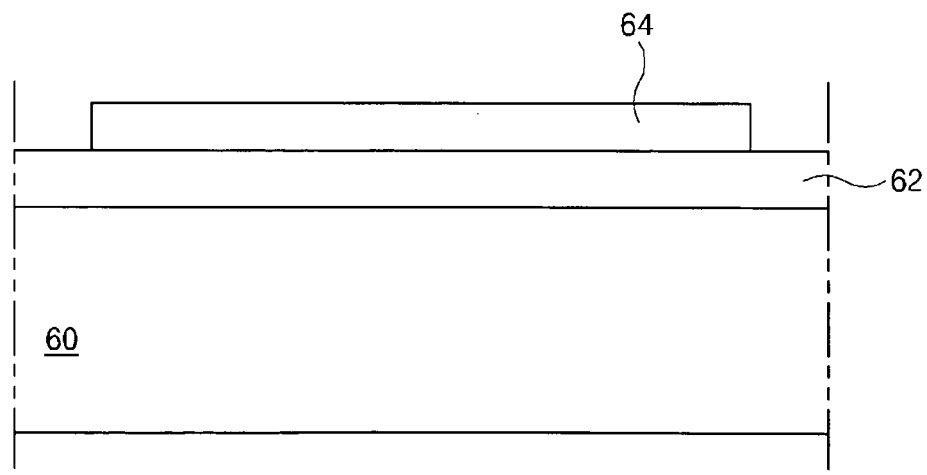
Figure 4B:
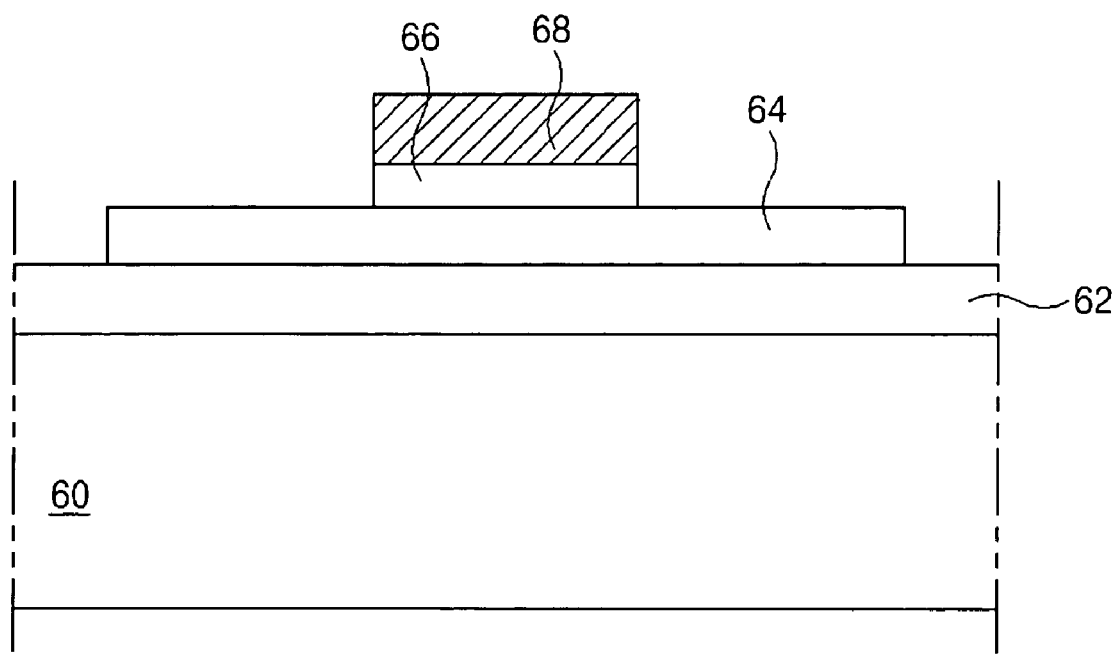
Figure 4C:
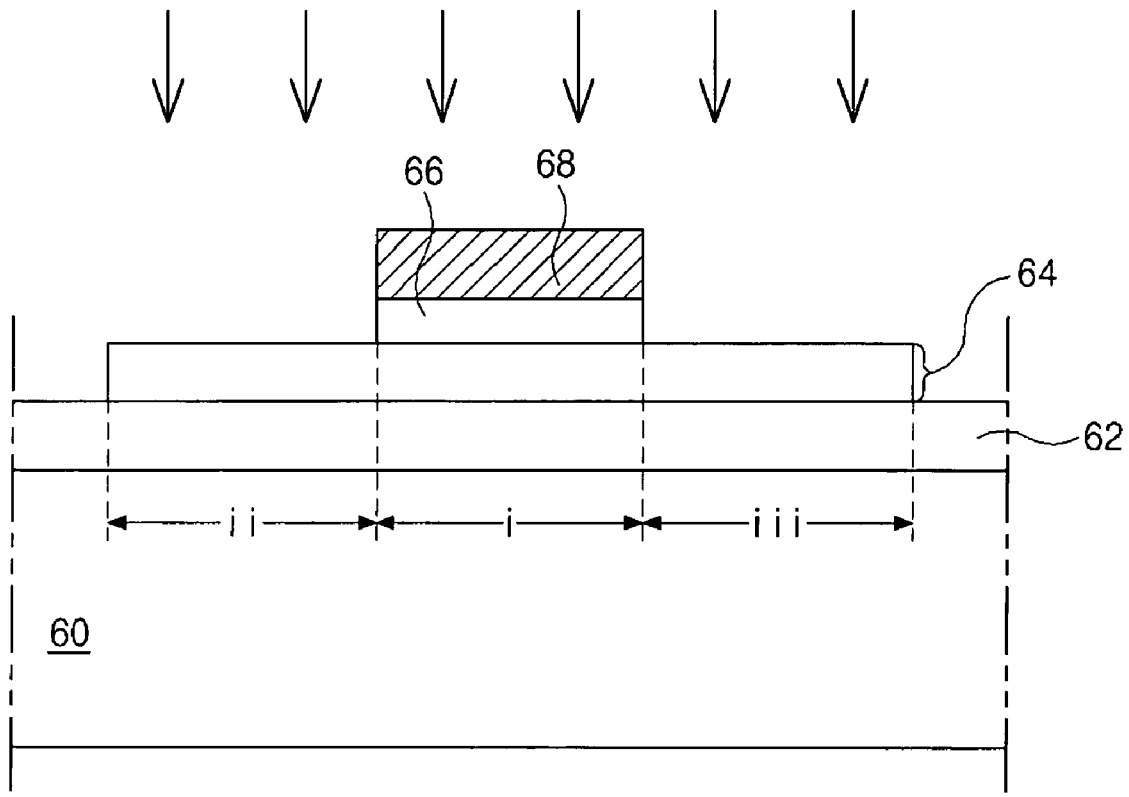
Figure 5A:
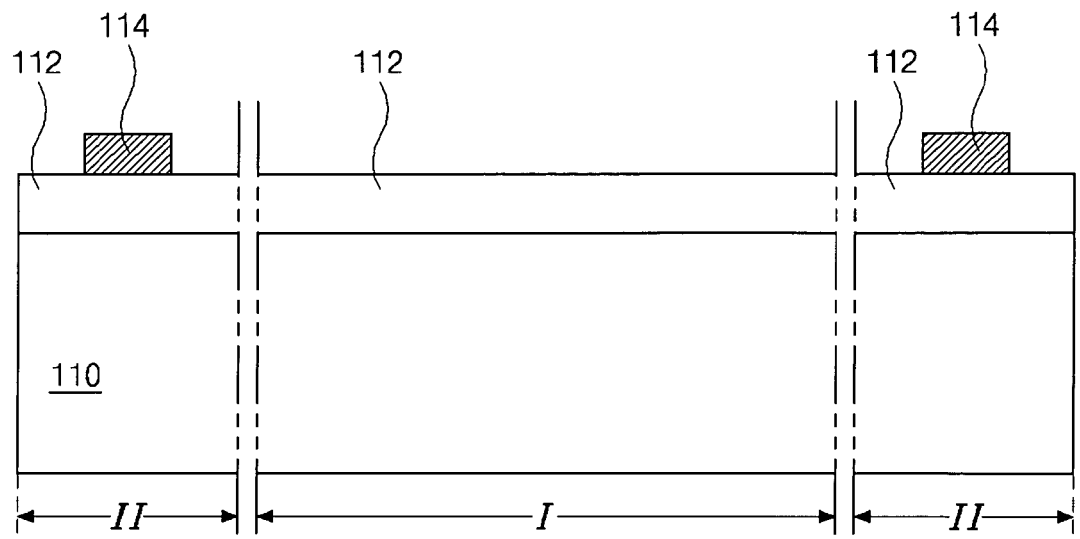

Referring to FIG. 5A, a buffer layer 112 may be formed on a substrate 110 having a first region "I" and a second region "II" arranged at opposing sides of the first region "I." Alignment keys 114 may be formed on portions of the buffer layer 112 within the second region "II." In one aspect of the present invention, the buffer layer 112 may be formed of an insulating material such as silicon oxide ($SiO_2$), silicon nitride (SiNx), and the like. In one aspect of the present invention, the alignment keys 114 may be formed of a metallic material such as chromium (Cr) via a photolithographic process or other suitable patterning process. While not shown in FIG. 5A, the alignment keys 114 may be disposed at edge portions of the substrate 110.

Figure 5B:
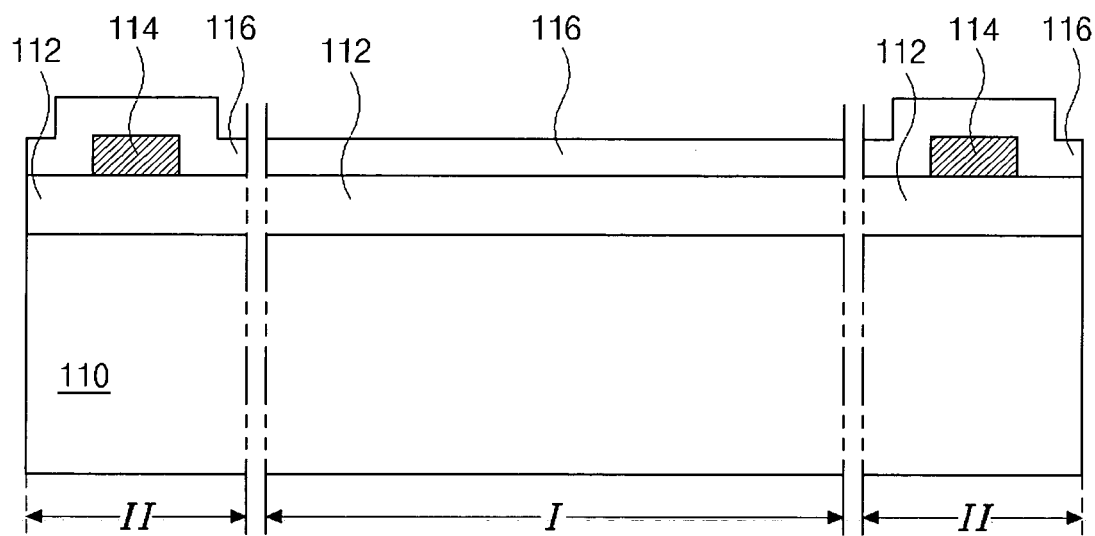

Referring to FIG. 5B, an amorphous silicon layer 116 may be formed on the buffer layer 112 and the alignment keys 114.

Figure 5C:
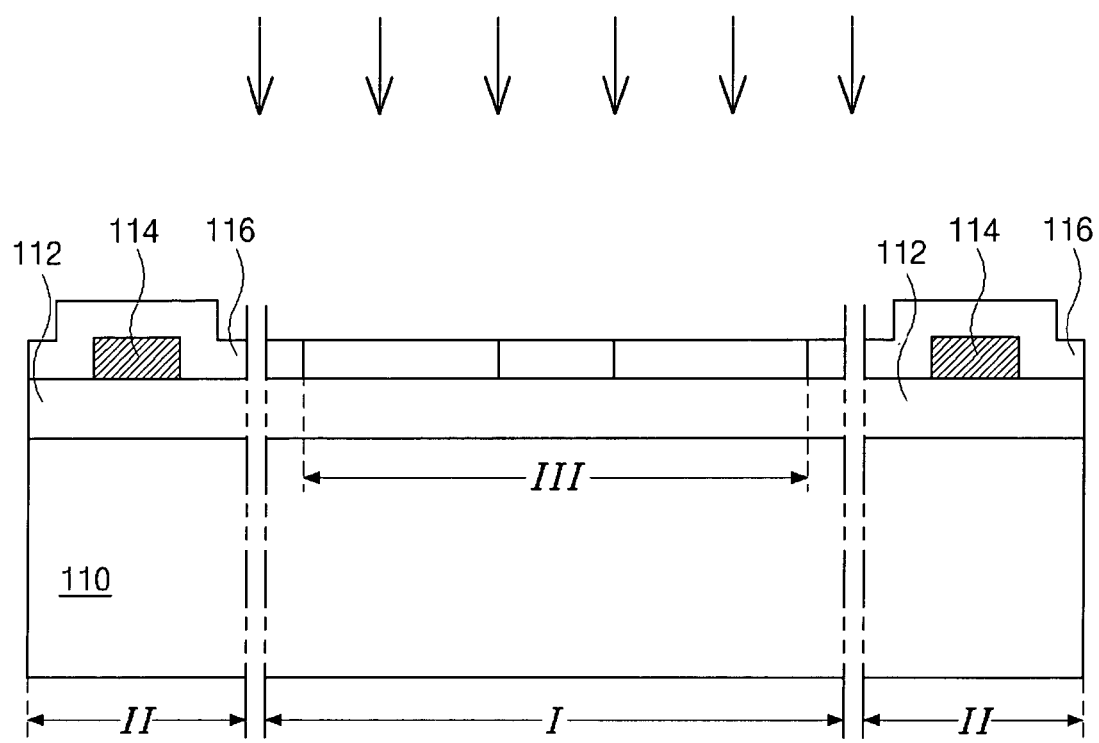

Referring to FIG. 5C, a portion of the amorphous silicon layer 116 in a third region "III" may be selectively crystallized using alignment keys 114 as a reference. According to principles of the present invention, the third region "III" may comprise a portion of the first region "I." In one aspect of the present invention, the amorphous silicon layer 116 may be selectively crystallized using a sequential lateral solidification (SLS) method. By crystallizing portions of the amorphous silicon layer 116 in only the third region "III" using the alignment key 114 via the SLS method, TFT fabrication efficiency may be improved, electrical characteristics of a subsequently formed TFT may be improved, and a grain boundary of the crystallized portion in third region "III" may be precisely positioned.

Figure 5D:
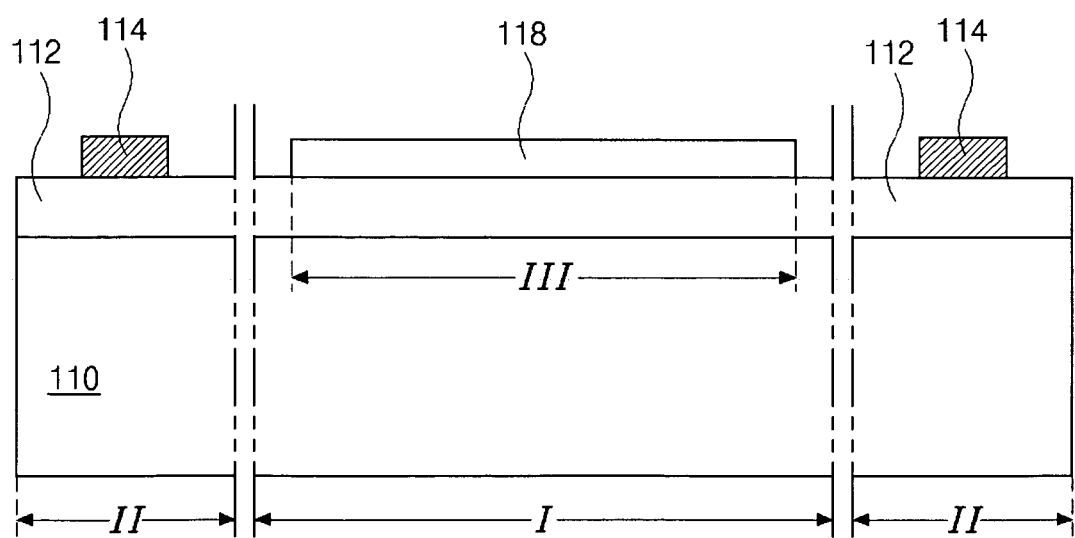

Referring to FIG. 5D, portions of the amorphous silicon layer 116 outside the third region "III" may be patterned (i.e., removed) to form a polycrystalline silicon layer 118. Accordingly, the polycrystalline silicon layer 118 may be formed using the alignment keys 114 as a reference.

Figure 5E:
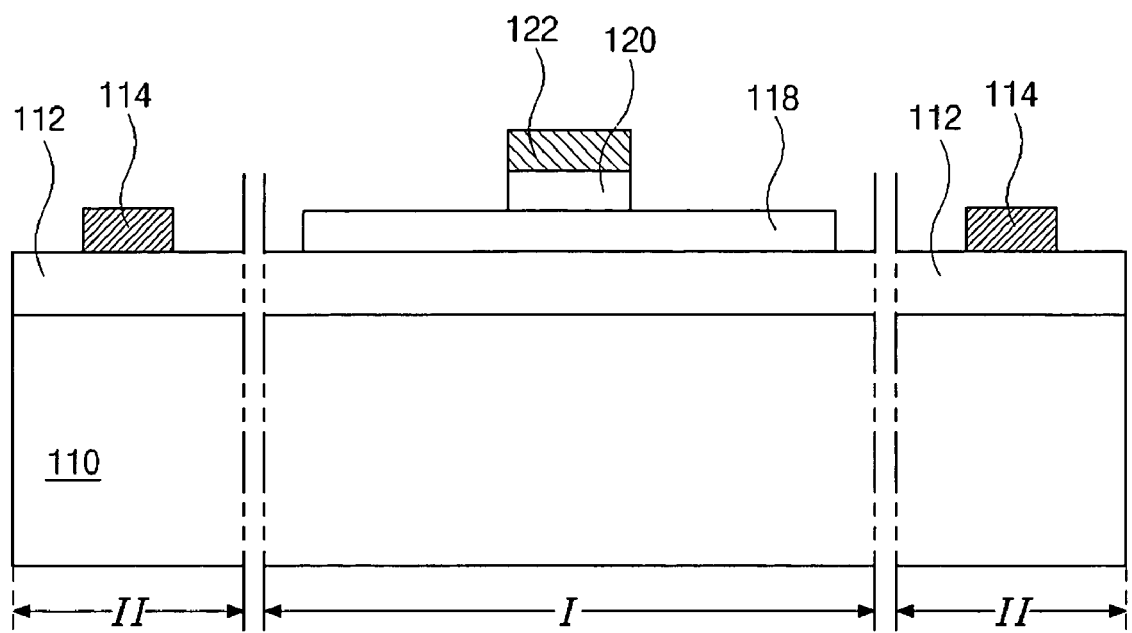

Referring to FIG. 5E, a gate insulating layer 120 and a gate electrode 122 may be sequentially formed on the polycrystalline silicon layer 118. In one aspect of the present invention, the gate insulating layer 120 and the gate electrode 122 may be formed on the polycrystalline silicon layer 118 using the alignment keys 114 as a reference.

Referring to FIG. 5F, the polycrystalline silicon layer 118 may be doped with impurities using the gate electrode 122 as a doping mask. Accordingly, the polycrystalline silicon layer 118 may include a channel region "IV" defined by source and drain regions "V" and "VI" formed at opposing sides thereof. According to principles of the present invention, the portion of the polycrystalline silicon layer 118 in the channel region "IV" does not include impurities and the portions of the polycrystalline silicon layer 118 in the source and drain regions "V" and "VI" include impurities.

Figure 5G:
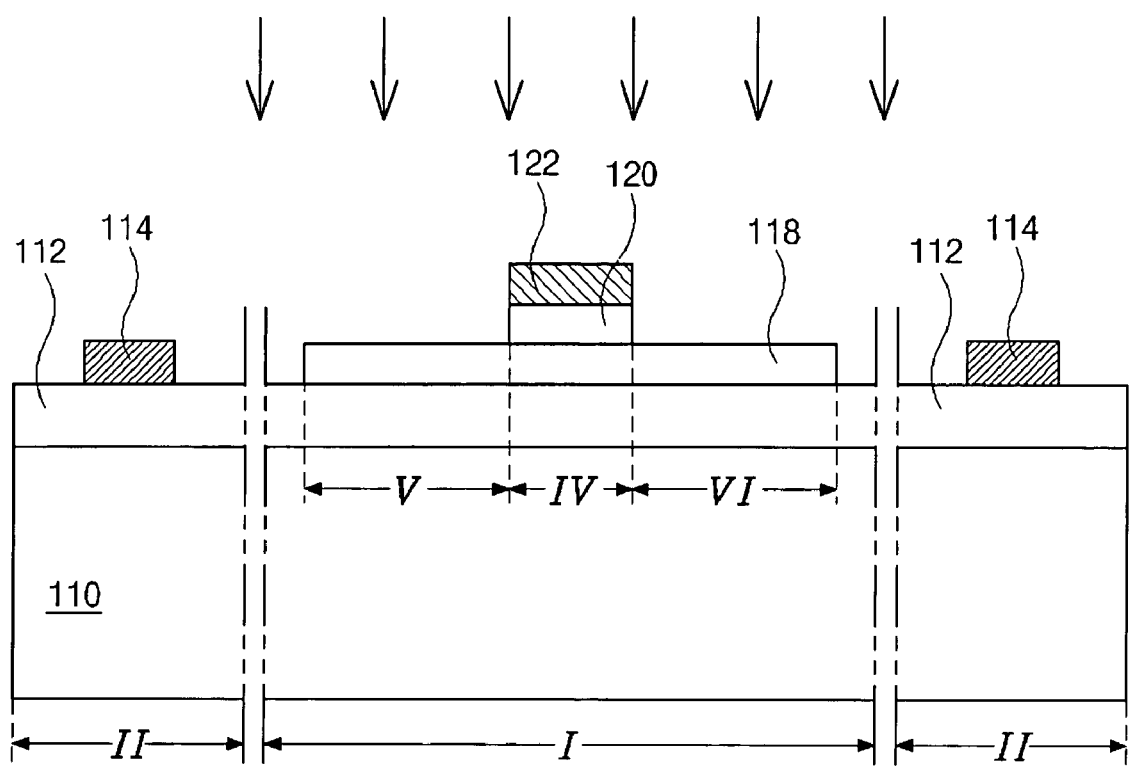

Referring to FIG. 5G, portions of the polycrystalline silicon layer 118 in the source and drain regions "V" and "VI" may be "activated" in a heat treatment. According to principles of the present invention, impurities introduced into the polycrystalline silicon layer 118 in the source and drain regions "V" and "VI" during the doping process outlined in FIG. 5F cause portions of the polycrystalline silicon layer 118 to become amorphized. Accordingly, the "activating" heat treatment may be performed to re-crystallize the amorphized portions of the polycrystalline silicon layer 118 and allow the impurities to adequately function as charge carriers. In one aspect of the present invention, a laser annealing method may be used to activate the amorphized portions of polycrystalline silicon layer 118.

Figure 5H:
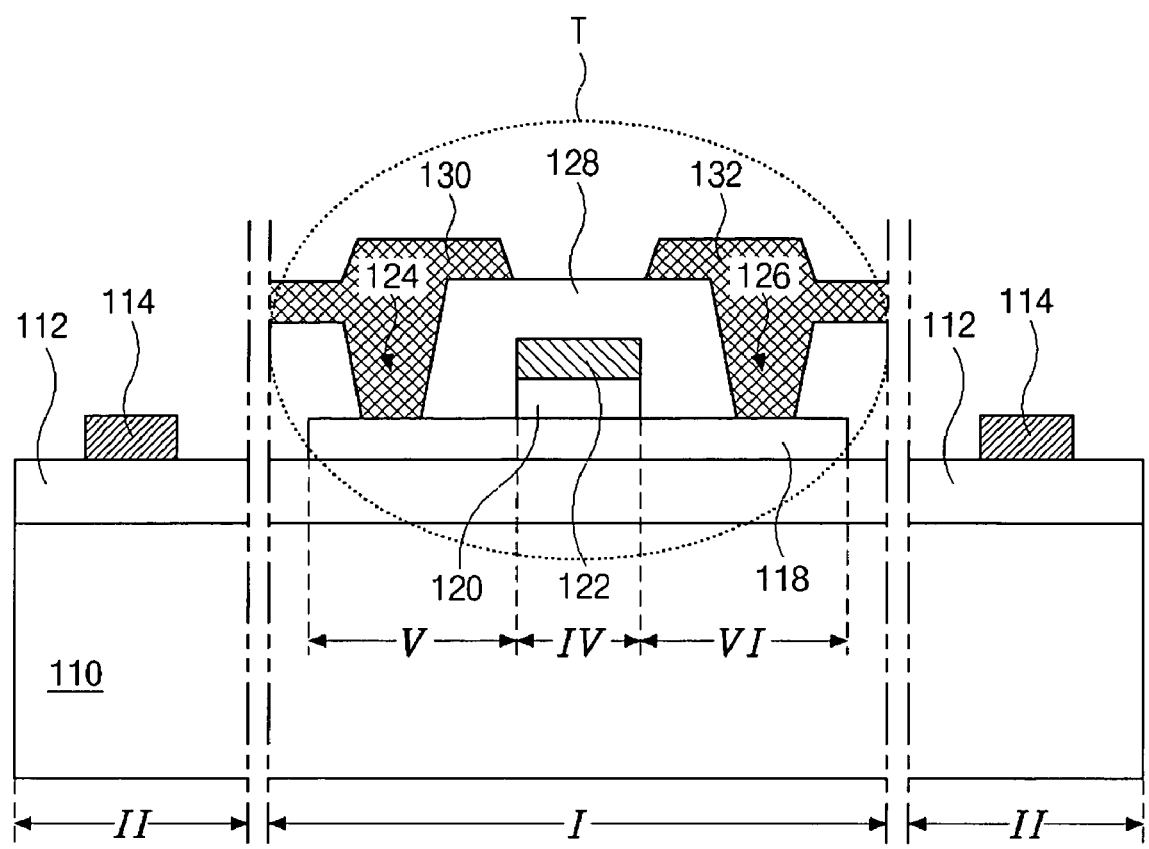

Referring to FIG. 5H, an interlayer insulating layer 128 may be formed on the gate electrode 122 and source and drain electrodes 130 and 132 may be formed on the interlayer insulating layer 128. In one aspect of the present invention, the interlayer insulating layer 128 may, for example, include a first contact hole 124 exposing the polycrystalline silicon layer 118 in the source region "V" and a second contact hole 126 exposing the polycrystalline silicon layer 118 in the drain region "VI." In another aspect of the present invention, the source electrode 130 may be electrically connected to the polycrystalline silicon layer 118 in the source region "V" via the first contact hole 124 and the drain electrode 132 may be electrically connected to the polycrystalline silicon layer 118 in the drain region "VI" via the second contact hole 126. Accordingly, the polycrystalline silicon layer 118, the gate electrode 122, the source electrode 130, and the drain electrode 132, together, constitute a thin film transistor (TFT) "T."

As described above with respect to FIGS. 5A-5H, the portion of the amorphous silicon layer 116 in the third region "III" may be selectively crystallized using the alignment keys 114 and an SLS method. Accordingly, a TFT fabrication efficiency may be improved, electrical characteristics of the TFT may be improved, and a grain boundary of the re-crystallized portion of the polycrystalline silicon layer 118 in third region "III" may be precisely and accurately positioned. The fabrication method shown in FIGS. 5A-5H, however, undesirably requires an activation step that re-crystallizes amorphized, previously crystallized silicon material. Moreover, because the gate electrode 122 is used as a doping mask and because the polycrystalline silicon layer 118 is activated with the gate electrode 122 formed thereon, the polycrystalline silicon layer 118 contains a junction region aligned with edges of the gate electrode 122. The polycrystalline silicon in the junction region has a non-uniform crystallinity which can promote undesirable leakage current and degrade the electrical characteristics of the TFT "T." To improve upon the above-cited drawbacks of the first embodiment, the principles of the present invention provide a second embodiment illustrated in FIGS. 6A to 6G.

Figure 6A:
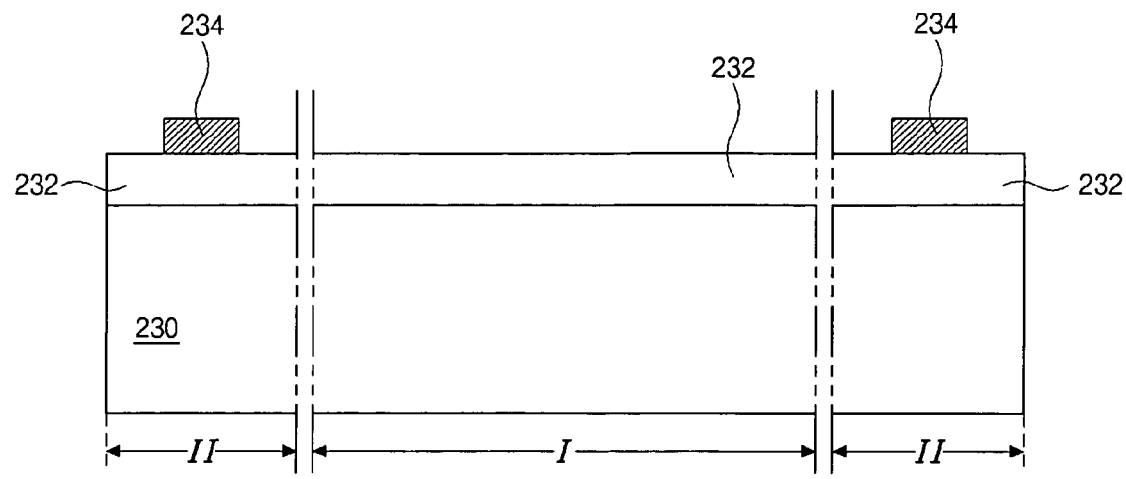

Referring to FIG. 6A, a buffer layer 232 may be formed on a substrate 230 having a first region "I" and a second region "II" arranged at opposing sides of the first region "I." Alignment keys 234 may be formed on portions of the buffer layer 232 within the second region "II." In one aspect of the present invention, the buffer layer 232 may be formed of an insulating material such as silicon oxide ($SiO_2$), silicon nitride ($SiNx$), and the like. In one aspect of the present invention, the alignment keys 234 may be formed of a metallic material such as chromium (Cr) via a photolithographic process or other suitable patterning process. While not shown in FIG. 6A, the alignment keys 234 may be disposed at edge portions of the substrate 230.

Figure 6B:
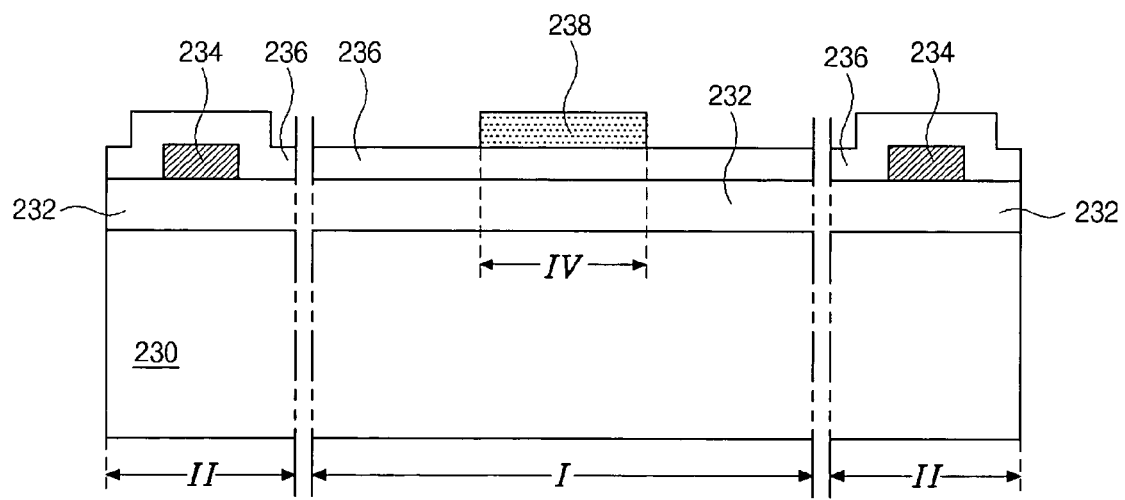

Referring to FIG. 6B, an amorphous silicon layer 236 may be formed on the buffer layer 236 and the alignment keys 234. Subsequently, a dummy pattern 238 may be formed on a portion of the amorphous silicon layer 236 in channel region "IV." According to principles of the present invention, the channel region "IV" may comprise a portion of the first region "I." In one aspect of the present invention, the dummy pattern 238 may be formed using the alignment keys 234 as a reference. As will be described in greater detail below, carriers (e.g., electrons and holes) may flow through a subsequently formed polycrystalline silicon layer provided in the channel region "IV."

Referring to FIG. 6C, the amorphous silicon layer 236 may be doped with impurities using the dummy pattern 238 as a doping mask. In one aspect of the present invention, the impurities may include ions of Group III and V elements. Consequently, the amorphous silicon layer 236 may include a channel region "IV" defined by source and drain regions "V" and "VI" formed at opposite sides thereof. According to principles of the present invention, the portion of the amorphous silicon layer 236 in the channel region "IV" does not include impurities and portions of the amorphous silicon layer 236 in the source and drain regions "V" and "VI" includes impurities.

Figure 6D:
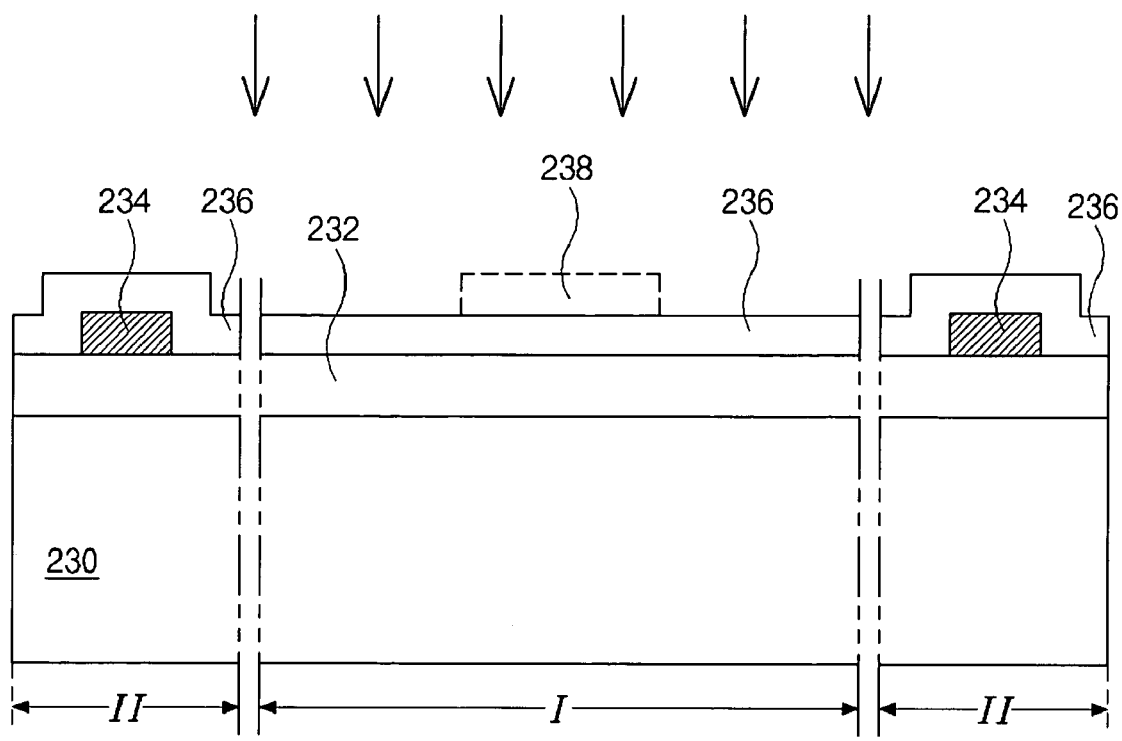

Referring to FIG. 6D, the dummy pattern 238 may be removed and portions of the amorphous silicon layer 236 in the third region "III" may be selectively crystallized. According to principles of the present invention, the third region "III" may comprise a portion of the first region "I." In one aspect of the present invention, the amorphous silicon layer 236 may be selectively crystallized using a sequential lateral solidification (SLS) method. In another aspect of the present invention, the amorphous silicon layer 236 may be selectively crystallized using alignment keys 234 as a reference. Because the amorphous silicon layer 236 is crystallized after being doped, impurities in the amorphous silicon layer 236 are activated simultaneously with the crystallization and the additional activation/re-crystallization step described with reference to FIGS. 5A-5H is thus eliminated.

Figure 6E:
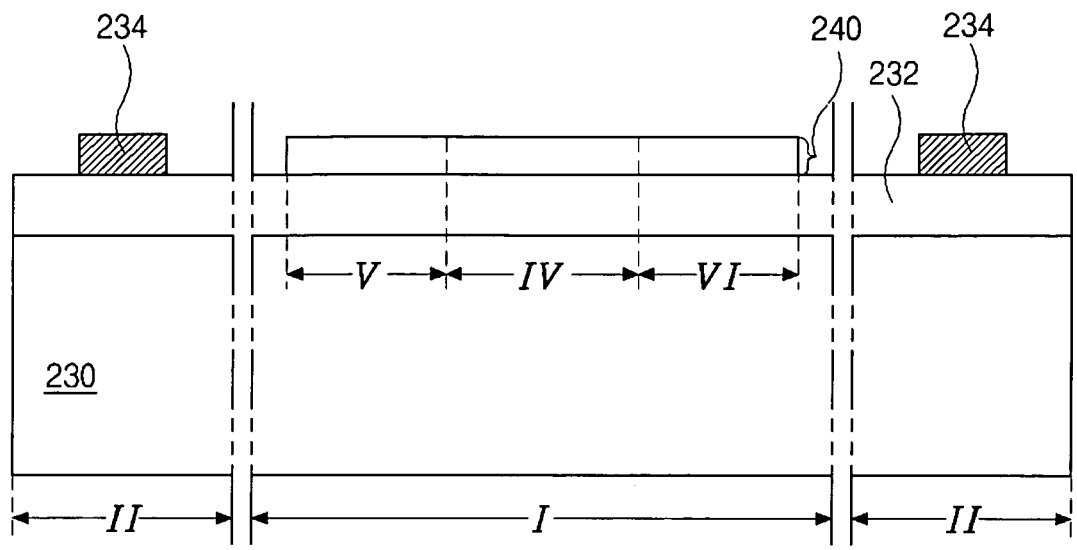

Referring to FIG. 6E, portions of the amorphous silicon layer 236 outside the third region "III" may be patterned (i.e., removed) to form a polycrystalline silicon layer 240. Accordingly, the polycrystalline silicon layer 240 may include the channel region "IV" defined by the source and drain regions "V" and "VI" formed at opposing sides thereof using the alignment keys 234 as a reference. Because the dummy pattern 238 shown in FIG. 6C and the polycrystalline silicon layer 240 are aligned using the same alignment keys 234, the channel region "IV" and the source and drain regions "V" and "VI" may be precisely and accurately defined within the polycrystalline silicon layer 240.

Figure 6F:
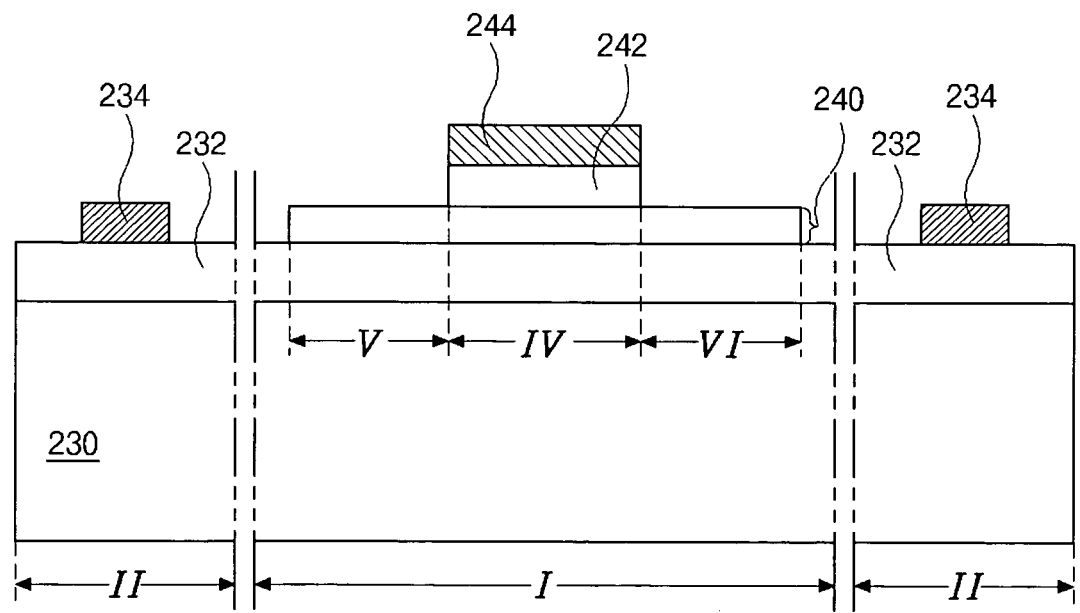

Referring to FIG. 6F, a gate insulating layer 242 and a gate electrode 244 may be sequentially formed on the polycrystalline silicon layer 240. In one aspect of the present invention, the gate insulating layer 242 and the gate electrode 244 may be formed on the polycrystalline silicon layer 240 using the alignment keys 234 as a reference. Because the gate electrode 244 and the dummy pattern 238 shown in FIG. 6C are aligned using the same alignment keys 234, the gate electrode 244 may be precisely and accurately aligned with the channel region "IV" to substantially the same degree as the alignment of such structures in a self-aligned TFT.

Figure 6G:
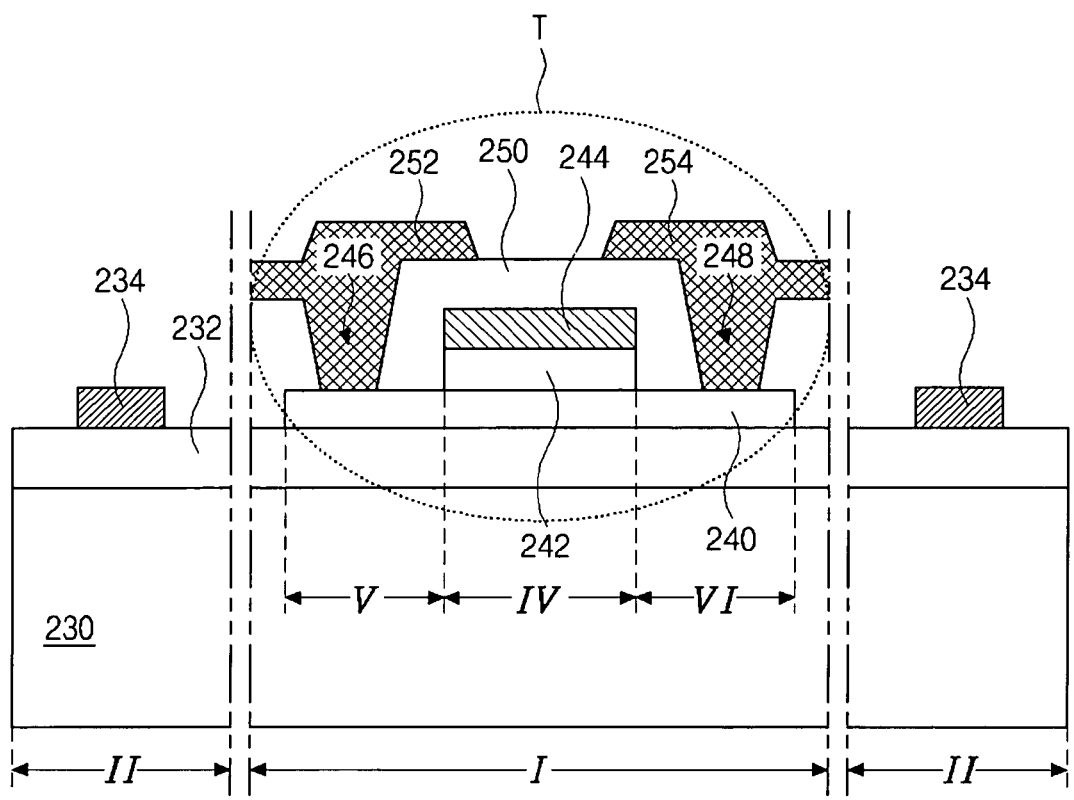

Referring to FIG. 6G, an interlayer insulating layer 250 may be formed on the gate electrode 244 and source and drain electrodes 252 and 254 may be formed on the interlayer insulating layer 250. In one aspect of the present invention, the interlayer insulating layer 250 may, for example, include a first contact hole 246 exposing the polycrystalline silicon layer 240 in the source region "V" and a second contact hole 248 exposing the polycrystalline silicon layer 240 in the drain region "VI." In another aspect of the present invention, the source electrode 252 may be electrically connected to the polycrystalline silicon layer 240 in the source region "V" via the first contact hole 246 and the drain electrode 254 may be electrically connected to the polycrystalline silicon layer 240 in the drain region "VI" via the second contact hole 248. Accordingly, the polycrystalline silicon layer 240, the gate electrode 244, the source electrode 252, and the drain electrode 254, together, constitute a thin film transistor (TFT) "T."

As described above with respect to FIGS. 6A-6G, the amorphous silicon layer 236 may be selectively crystallized after being doped with impurities such that the impurities are activated simultaneously with the crystallization step. Accordingly, the additional activation/re-crystallization step previously described with respect to FIGS. 5A-5H is not required and the efficiency with which the TFT is fabricated may be improved. Moreover, the amorphous silicon layer 236 may be crystallized without having the gate electrode 244 formed thereon. Accordingly, the polycrystalline silicon layer 240 does not include a junction aligned with edges of the gate electrode 244, ensuring uniform crystallinity which improves electrical characteristics of the TFT "T." Because the dummy pattern, the polycrystalline silicon layer, the gate insulating layer, and the gate electrode are aligned using the same alignment keys as a reference, the gate electrode is precisely aligned over the channel region "IV" of the polycrystalline silicon layer 240 even though the TFT "T" is not of the aforementioned self-aligned type.

As described above with respect to FIGS. 5A-5H and 6A-6G, the first and second embodiments undesirably require additional processes to form and use the alignment keys. The additional process related to the formation and use of the alignment keys causes the cost and time required to fabricate a TFT to increase. Therefore, and to improve upon the above-cited drawbacks of the first and second embodiments, the principles of the present invention provide third and fourth embodiments illustrated in FIGS. 7A-7H and 8A-8F, respectively.

With general reference to FIGS. 7A-7H, the principles of the present embodiment may be applied to a substrate having a TOC (TFT on Color filter) structure. According to the TOC structure, a color filter layer is formed on an array substrate of an LCD device and a TFT is formed on the color filter layer.

Figure 7A:
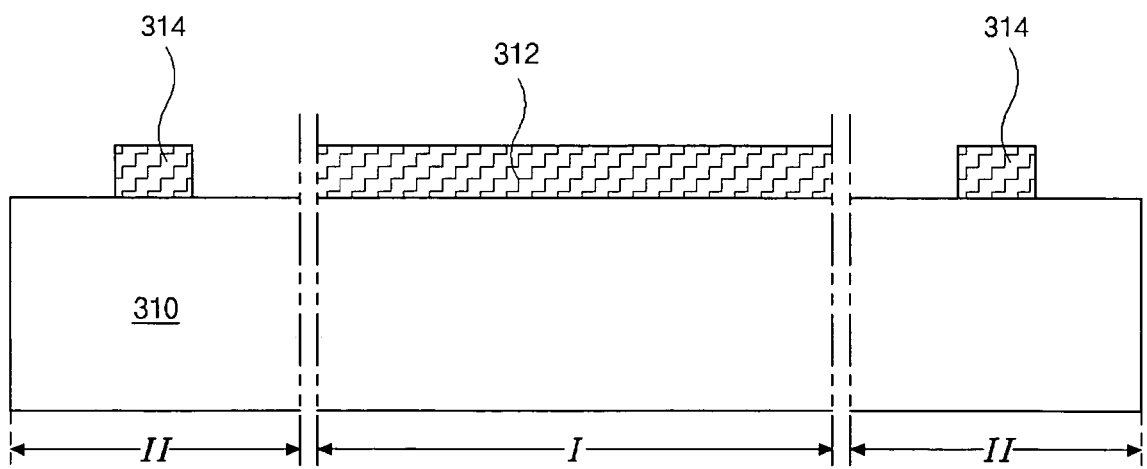

Referring now to FIG. 7A, a color filter layer 312 and alignment keys 314 may be formed on a substrate 310 having a first region "I" and a second region "II" arranged at opposing sides of the first region "I." For example, the color filter layer 312 may be formed in the first region "I" while and the alignment keys 314 may be formed in the second region "II." In one aspect of the present invention, both the color filter layer 312 and the alignment keys 314 may be formed of a color resin material. In another aspect of the present invention, the color filter layer 312 and the alignment keys 314 may be formed simultaneously. In yet another aspect of the present invention, the color filter layer 312 and the alignment keys 314 may be formed from the same layer. While not shown in FIG. 7A, the color filter layer 312 may, for example, include a plurality of color sub-filters separated by a black matrix. In one aspect of the present invention, the color filter layer be include color resin selected from at least one of red, green, and blue color resins. In another aspect of the present invention, the color filter layer 312 may, for example, include red, green, and blue color sub-filters alternately arranged on the substrate 310. Additionally, the alignment keys 314 may be formed of a single color resin (as shown in FIG. 7A) or a plurality of color resins. Further, the alignment keys 314 may be disposed at edge portions of the substrate 310.

Figure 7B:
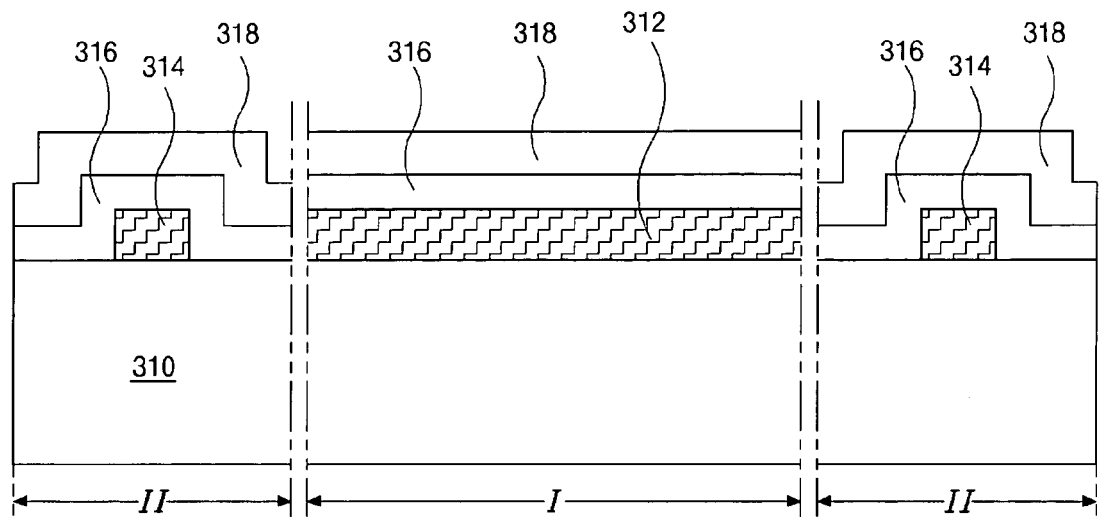

Referring to FIG. 7B, a buffer layer 316 may be formed on the color filter layer 312 and the alignment keys 314 and an amorphous silicon layer 318 may be formed on the buffer layer 316. In one aspect of the present invention, the buffer layer 316 may be formed of an insulating material such as silicon oxide (SiO$_2$), silicon nitride (SiNx), and the like.

Figure 7C:
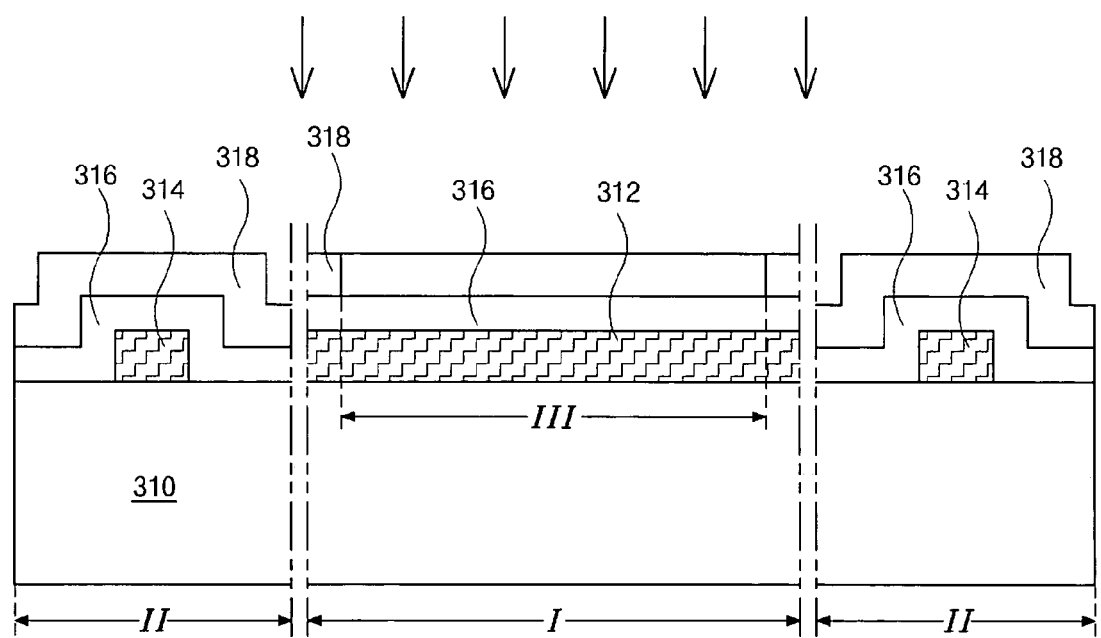

Referring to FIG. 7C, a portion of the amorphous silicon layer 318 in a third region "III" may be selectively crystallized using alignment keys 314 as a reference. According to principles of the present invention, the third region "III" may comprise a portion of the first region "I." In one aspect of the present invention, the amorphous silicon layer 318 may be selectively crystallized using a sequential lateral solidification (SLS) method. By crystallizing portions of the amorphous silicon layer 318 in only the third region "III" using the alignment keys 314 via the SLS method, TFT fabrication efficiency may be improved, electrical characteristics of a subsequently formed TFT may be improved, and a grain boundary of the crystallized portion in third region "III" may be precisely positioned.

Figure 7D:
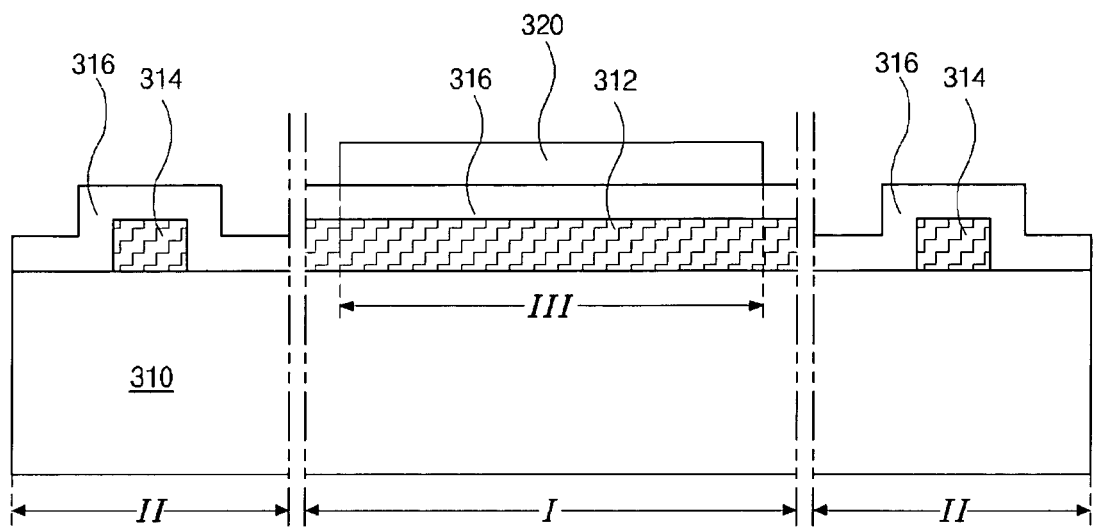

Referring to FIG. 7D, portions of the amorphous silicon layer 318 outside the third region "III" may be is patterned to form a polycrystalline silicon layer 320. The polycrystalline silicon layer 320 may be disposed using the alignment keys 314 as a reference.

Figure 7E:
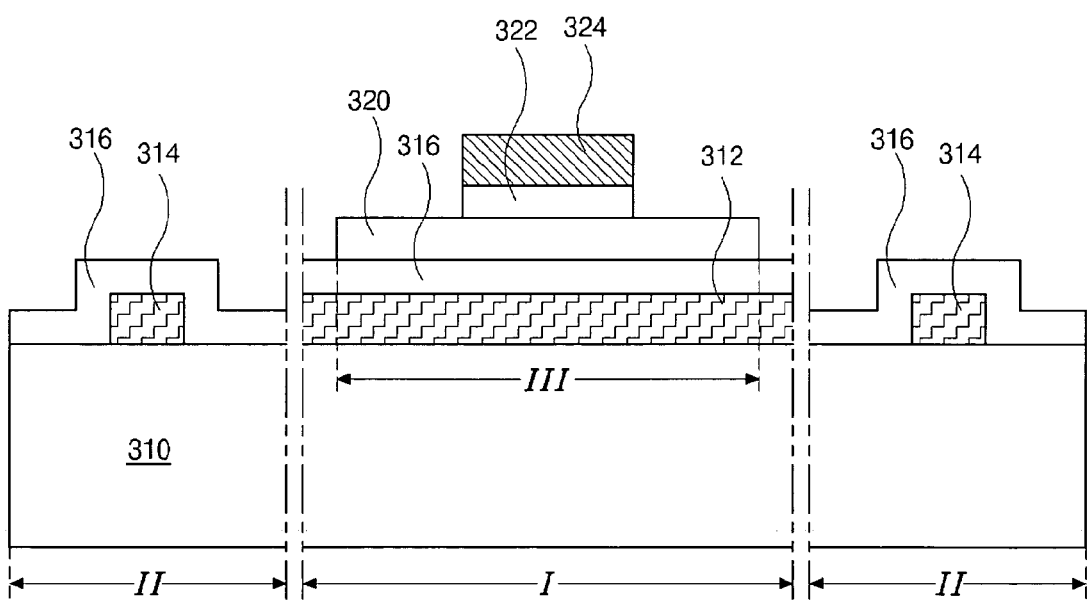

Referring to FIG. 7E, a gate insulating layer 322 and a gate electrode 324 may be sequentially formed on the polycrystalline silicon layer 320. In one aspect of the present invention, the gate insulating layer 322 and the gate electrode 324 may be formed on the polycrystalline silicon layer 320 using the alignment keys 314 as a reference.

Referring to FIG. 7F, the polycrystalline silicon layer 320 may be doped with impurities using the gate electrode 324 as a doping mask. Accordingly, the polycrystalline silicon layer 320 may include a channel region "IV" defined by source and drain regions "V" and "VI" formed at opposing sides of the channel region "IV." According to principles of the present invention, the portion of the polycrystalline silicon layer 320 in the channel region "IV" does not include impurities and the portions of the polycrystalline silicon layer 320 in the source and drain regions "V" and "VI" include impurities.

Figure 7G:
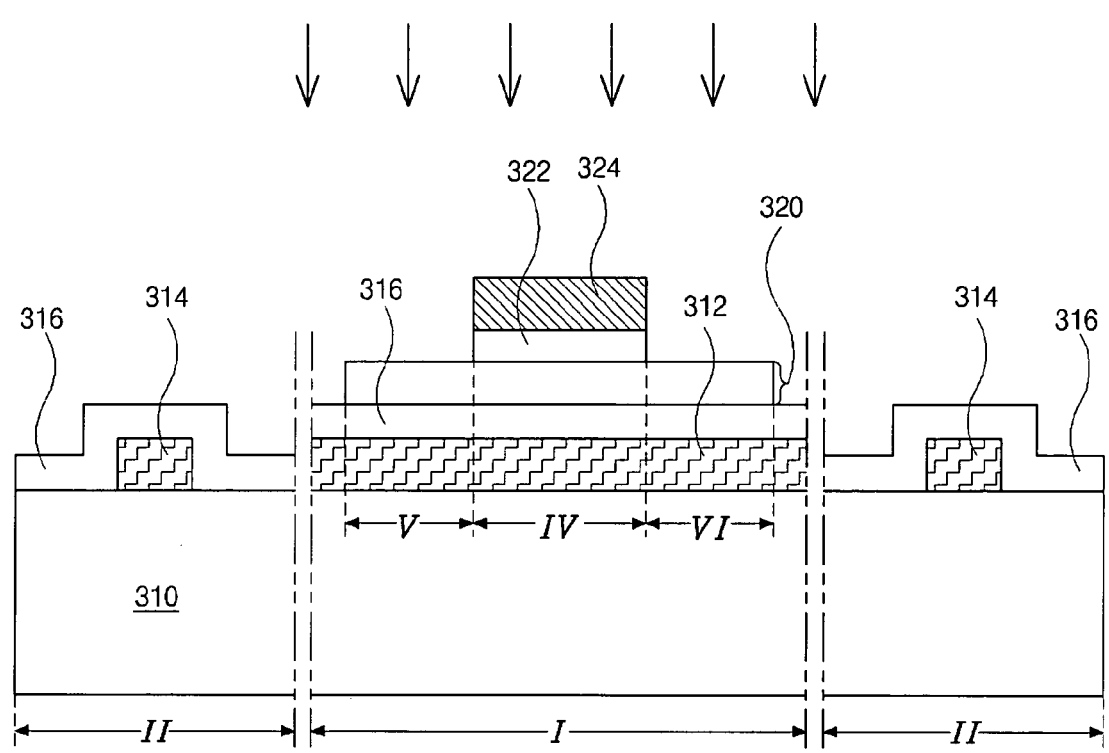

Referring to FIG. 7G, portions of the polycrystalline silicon layer 320 in the source and drain regions "V" and "VI" may be "activated" in a heat treatment. According to principles of the present invention, impurities introduced into the polycrystalline silicon layer 320 in the source and drain regions "V" during the doping process outlined in FIG. 7F cause portions of the polycrystalline silicon layer 320 to become amorphized. Accordingly, the "activating" heat treatment may be performed to re-crystallize the amorphized portions of the polycrystalline silicon layer 320 and allow the impurities to adequately function as charge carriers. In one aspect of the present invention, a laser annealing method may be used to activate the amorphized portions of polycrystalline silicon layer 320.

Figure 7H:
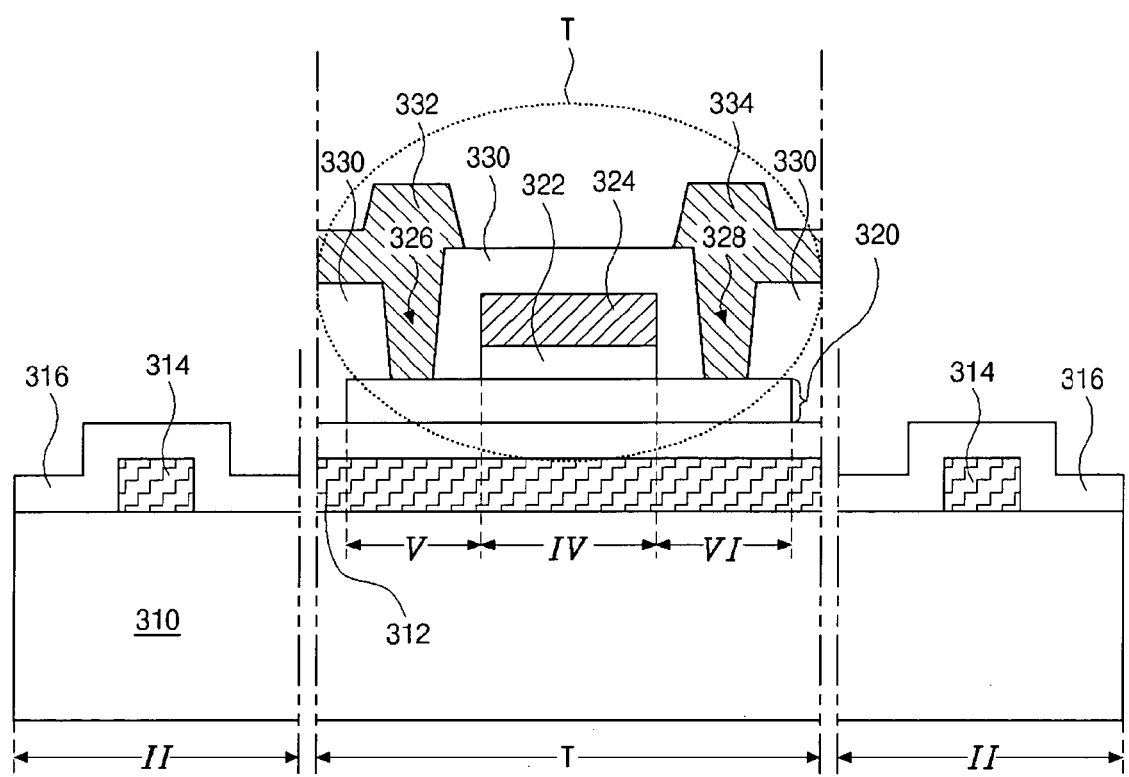

Referring to FIG. 7H, an interlayer insulating layer 330 may be formed on the gate electrode 324 and source and drain electrodes 332 and 334 may be formed on the interlayer insulating layer 330. In one aspect of the present invention, the interlayer insulating layer 330 may, for example, include a first contact hole 326 exposing the polycrystalline silicon layer 320 in the source region "V" and a second contact hole 328 exposing the polycrystalline silicon layer 320 in the drain region "VI." In another aspect of the present invention, the source electrode 332 may be electrically connected to the polycrystalline silicon layer 320 in the source region "V" via the first contact hole 326 and the drain electrode 334 may be electrically connected to the polycrystalline silicon layer 320 in the drain region "VI" via the second contact hole 328. Accordingly, the polycrystalline silicon layer 320, the gate electrode 324, the source electrode 332, and the drain electrode 334, together, constitute a thin film transistor (TFT) "T."

As described above with respect to FIGS. 7A-7H, the portion of the amorphous silicon layer 318 in the third region "III" may be selectively crystallized using the alignment keys 314 and an SLS method. Accordingly, a TFT fabrication efficiency may be improved, electrical characteristics of the TFT may be improved, and a grain boundary of the re-crystallized portion of the polycrystalline silicon layer 320 in third region "III" may be precisely positioned. Moreover, because the alignment keys 314 may be formed from the same material and layer as the color filter layer 312, additional processes related to the formation of the alignment keys 314 are eliminated, thereby simplifying the TFT fabrication process. However, because the gate electrode 324 is used as a doping mask and because the polycrystalline silicon layer 320 is activated with the gate electrode 324 thereon, the polycrystalline silicon layer 320 contains a junction region aligned with edges of the gate electrode 324. The polycrystalline silicon in the junction region has a non-uniform crystallinity which can promote undesirable leakage current and degrade the electrical characteristics of the TFT "T." To improve upon the above-cited drawbacks of the third embodiment, the principles of the present invention provide a fourth embodiment illustrated in FIGS. 8A to 8G.

With general reference to FIGS. 8A-8G, the principles of the present invention may be applied to a substrate having a TOC (TFT on Color filter) structure. According to the TOC structure, a color filter layer is formed on an array substrate of an LCD device and a TFT is formed on the color filter layer.

Figure 8A:
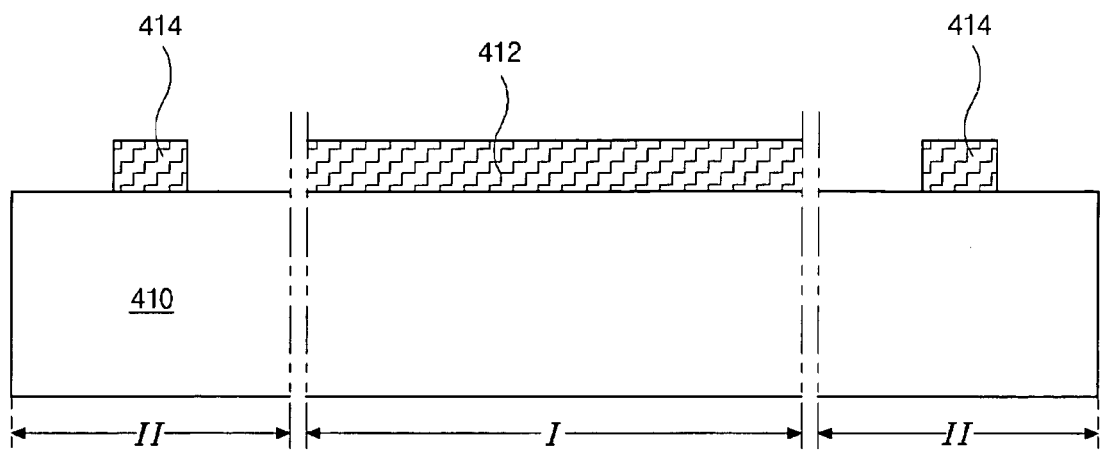
FIGS. 8A to 8G illustrate schematic cross-sectional views of a process of fabricating a TFT according to a fourth embodiment of the present invention.

Referring now to FIG. 8A, a color filter layer 412 and alignment keys 414 may be formed on a substrate 410 having a first region "I" and a second region "II" arranged at opposing sides of the first region "I." For example, the color filter layer 412 may be formed in the first region "I" while and the alignment keys 414 may be formed in the second region "II." In one aspect of the present invention, both the color filter layer 412 and the alignment keys 414 may be formed of a color resin material. In another aspect of the present invention, the color filter layer 412 and the alignment keys 414 may be formed simultaneously. In yet another aspect of the present invention, the color filter layer 412 and the alignment keys 414 may be formed from the same layer. In yet another aspect of the present invention, the color filter layer 412 and the alignment keys 414 may be formed from the same layer. While not shown in FIG. 7A, the color filter layer 412 may, for example, include a plurality of color sub-filters separated by a black matrix. In one aspect of the present invention, the color filter layer be include color resin selected from at least one of red, green, and blue color resins. In another aspect of the present invention, the color filter layer 412 may, for example, include red, green, and blue color sub-filters alternately arranged on the substrate 410. Additionally, the alignment keys 414 may be formed of a single color resin (as shown in FIG. 8A) or a plurality of color resins. Further, the alignment keys 414 may be disposed at edge portions of the substrate 410.

Figure 8B:
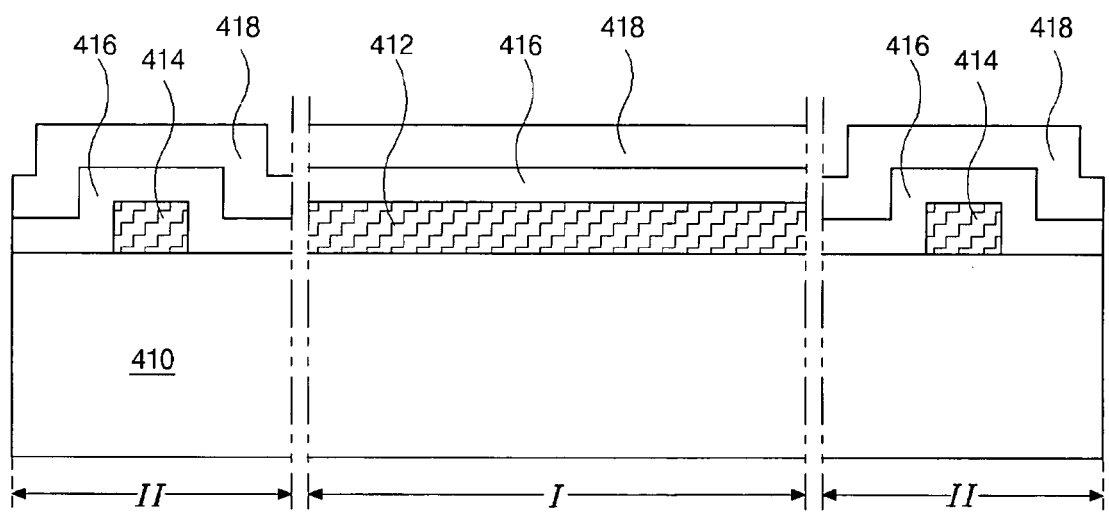

Referring to FIG. 8B, a buffer layer 416 may be formed on the color filter layer 412 and the alignment keys 414 and an amorphous silicon layer 418 may be formed on the buffer layer 416. In one aspect of the present invention, the buffer layer 416 may be formed of an insulating material such as silicon oxide ($SiO_2$), silicon nitride ($SiN_x$), and the like.

Figure 8C:
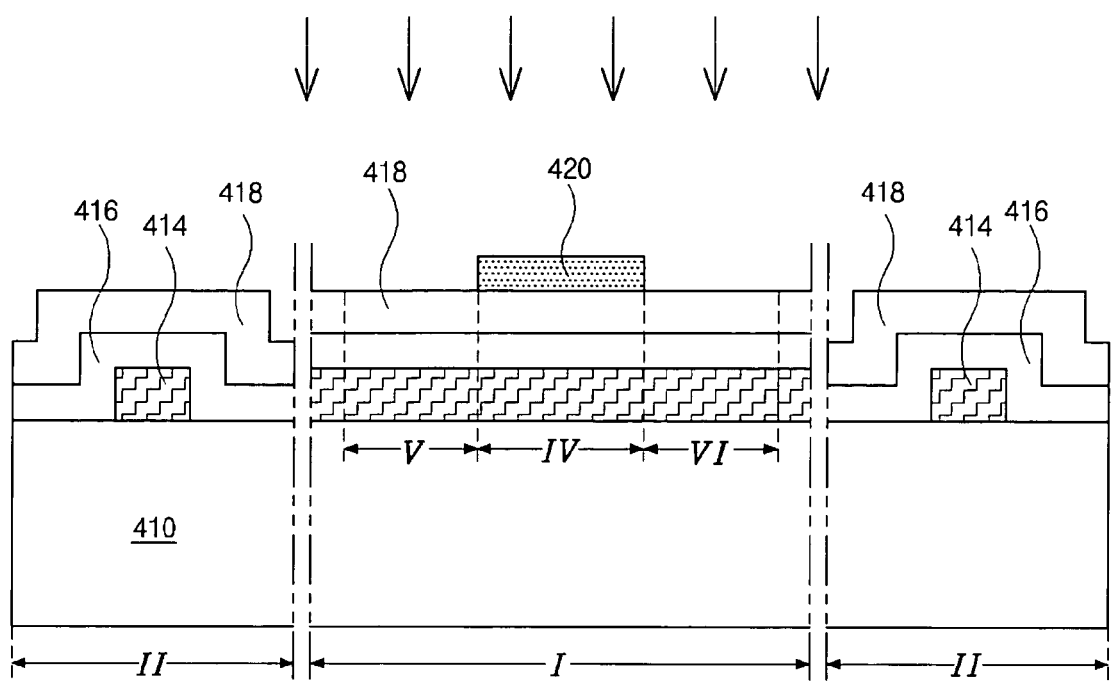

In FIG. 8C, a dummy pattern 420 may be formed on the amorphous silicon layer 418 in a channel region "IV." According to principles of the present invention, the channel region "IV" may comprise a portion of the first region "I." In one aspect of the present invention, the dummy pattern 420 may be formed using alignment keys 414 as a reference. As will be described in greater detail below, carriers (e.g., electrons and holes) may flow through a subsequently formed polycrystalline silicon layer provided in the channel region "IV."

After formation of the dummy pattern 420, the amorphous silicon layer 418 may be doped with impurities using the dummy pattern 420 as a doping mask. In one aspect of the present invention, the impurities may include ions of Group III and V elements. Consequently, the amorphous silicon layer 418 may include a channel region "IV" defined by source and drain regions "V" and "VI" at opposing sides thereof. According to principles of the present invention, the portion of the amorphous silicon layer 418 in the channel region "IV" does not include impurities and portions of the amorphous silicon layer 418 in the source and drain regions "V" and "VI" include impurities.

Figure 8D:
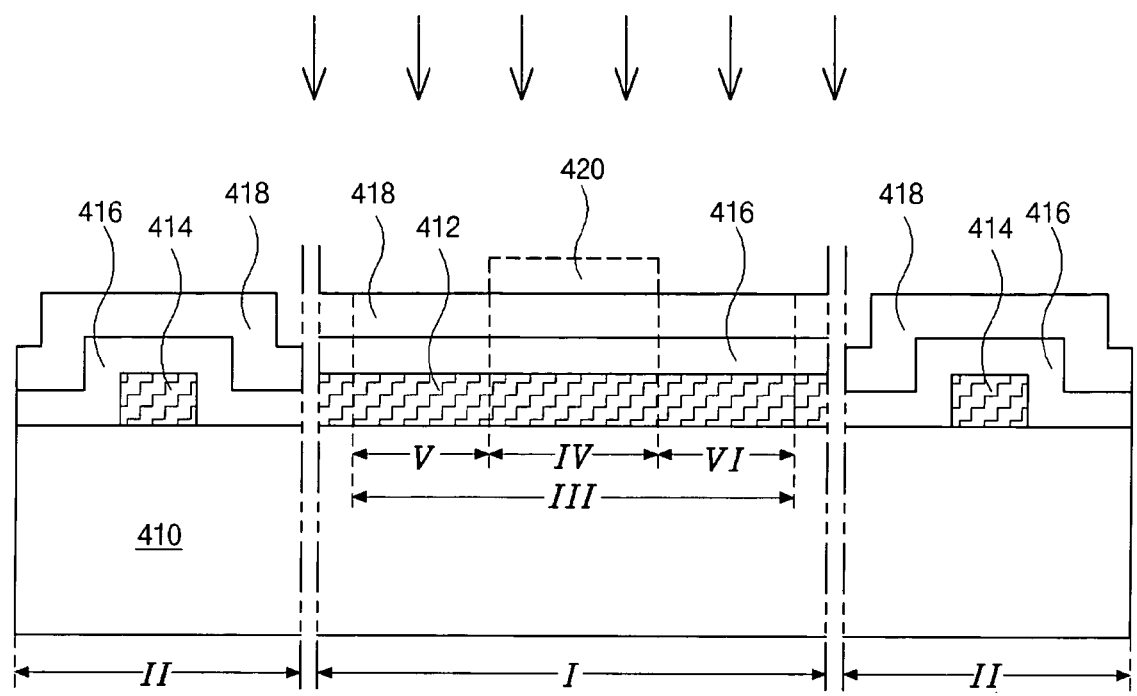

Referring to FIG. 8D, the dummy pattern 420 may be removed and portions of the amorphous silicon layer 418 in the third region "III" may be selectively crystallized. According to principles of the present invention, the third region "III" may comprise a portion of the first region "I." In one aspect of the present invention, the amorphous silicon layer 418 may be selectively crystallized using a sequential lateral solidification (SLS) method. In another aspect of the present invention, the amorphous silicon layer 418 may be selectively crystallized using alignment keys 414 as a reference. Because the amorphous silicon layer 418 is crystallized after being doped, impurities in the amorphous silicon layer 418 are activated simultaneously with the crystallization step and the additional activation/re-crystallization step described above with respect to FIGS. 7A-7H is thus eliminated.

Figure 8E:
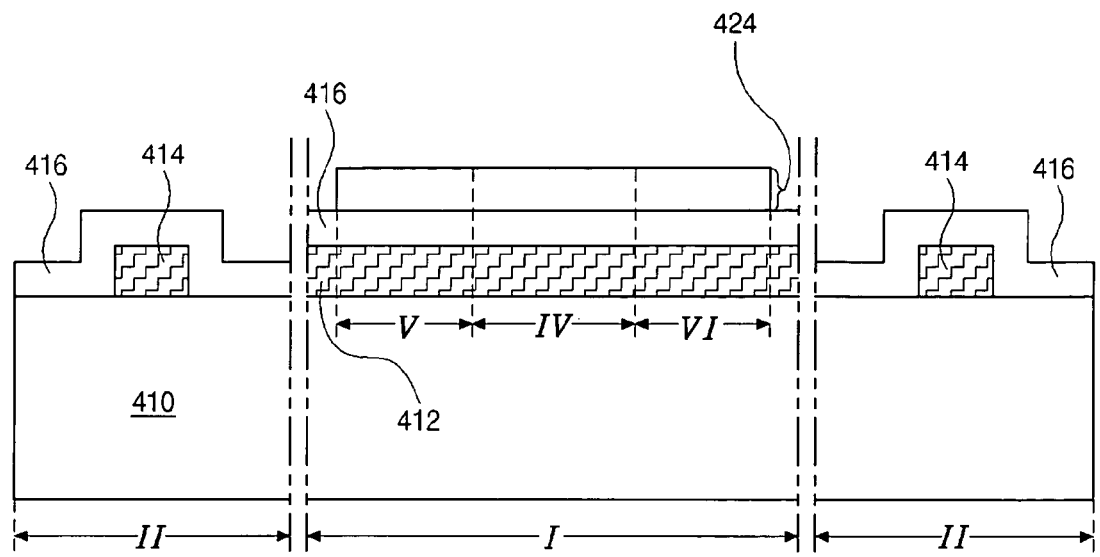

Referring to FIG. 8E, portions of the amorphous silicon layer 418 outside the third region "III" may be patterned (i.e., removed) to form a polycrystalline silicon layer 424. Accordingly, the polycrystalline silicon layer 424 may include the channel region "IV" defined by the source and drain regions "V" and "VI" formed at opposing sides thereof using the alignment keys 414 as a reference. Because the dummy pattern 420 shown in FIG. 8C and the polycrystalline silicon layer 424 are aligned using the same alignment keys 414, the channel region "IV" and the source and drain regions "V" and "VI" may be precisely and accurately defined within the polycrystalline silicon layer 424.

Figure 8F:
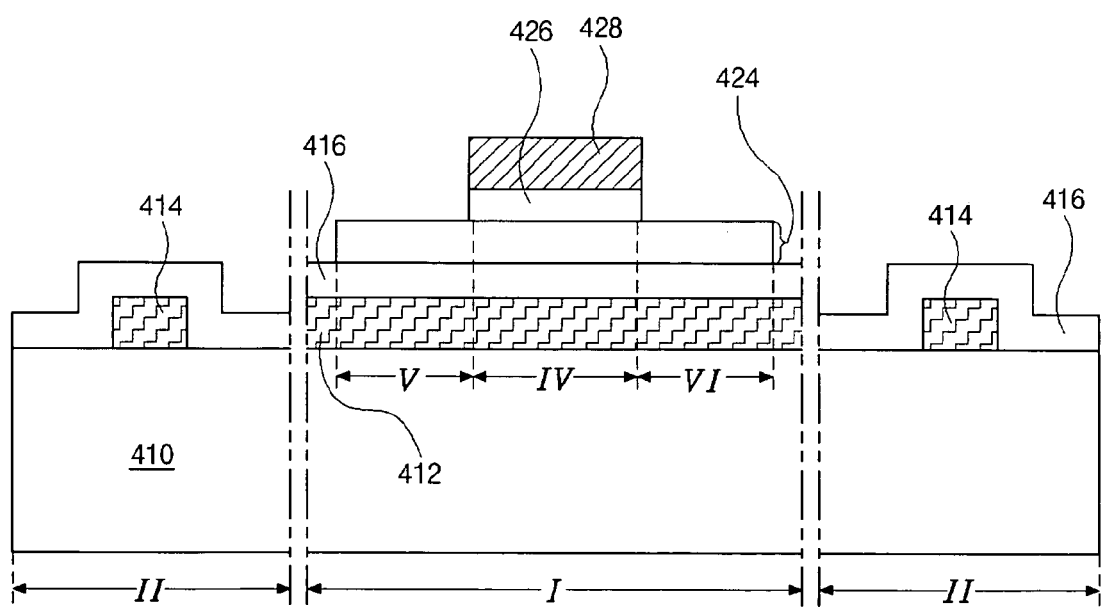

Referring to FIG. 8F, a gate insulating layer 426 and a gate electrode 428 may be sequentially formed on the polycrystalline silicon layer 424. In one aspect of the present invention, the gate insulating layer 426 and the gate electrode 428 may be formed on the polycrystalline silicon layer 424 using same alignment keys 414 as a reference. Because the gate electrode 426 and the dummy pattern 420 shown in FIG. 8C are aligned using the same alignment keys 414, the gate electrode 426 may be precisely and accurately aligned with the channel region "IV" to substantially the same degree as the alignment of such structures in a self-aligned TFT.

Figure 8G:
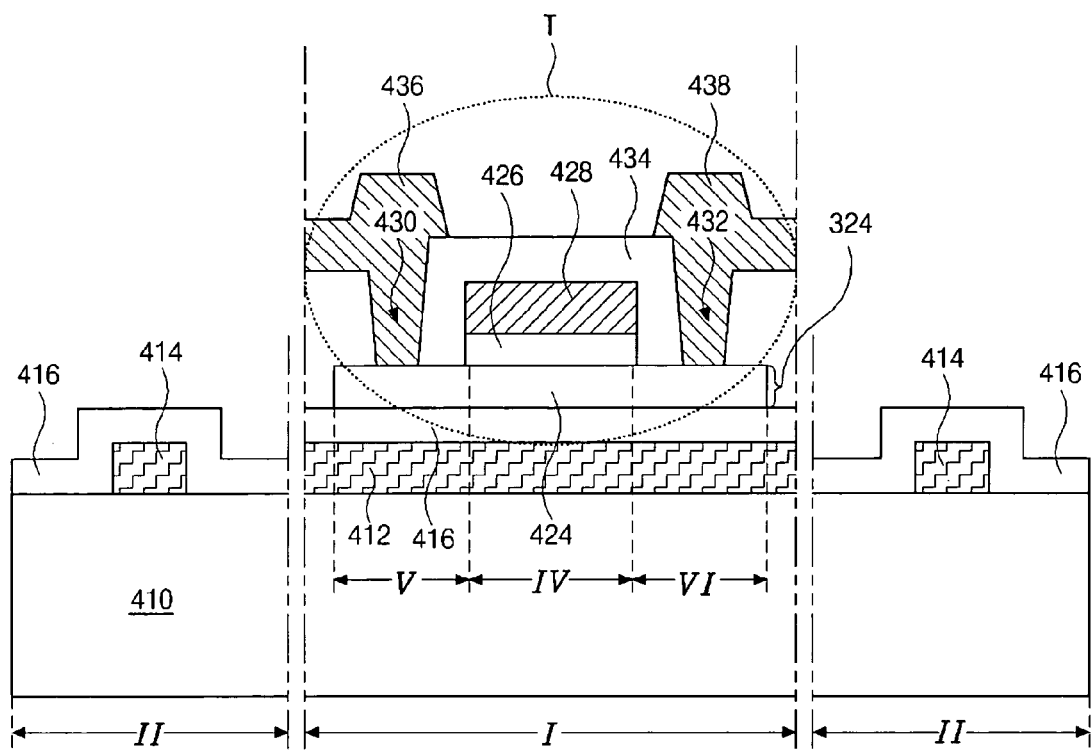

Referring to FIG. 8G, an interlayer insulating layer 434 may be formed on the gate electrode 428 and source and drain electrodes 436 and 438 may be formed on the interlayer insulating layer 434. In one aspect of the present invention, the interlayer insulating layer 434 may, for example, include a first contact hole 430 exposing the polycrystalline silicon layer 424 in the source region "V" and a second contact hole 432 exposing the polycrystalline silicon layer 424 in the drain region "VI." In another aspect of the present invention, the source electrode 436 may be electrically connected to the polycrystalline silicon layer 424 in the source region "V" via the first contact hole 430 and the drain electrode 438 may be electrically connected to the polycrystalline silicon layer 424 in the drain region "VI" via the second contact hole 432. Accordingly, the polycrystalline silicon layer 424, the gate electrode 428, the source electrode 436, and the drain electrode 438, together, constitute a thin film transistor (TFT) "T."

As described above with respect to FIGS. 8A-8G, the amorphous silicon layer 418 may be selectively crystallized after being doped with impurities such that the impurities are activated simultaneously with the crystallization step. Accordingly, the additional activation/re-crystallization step previously described with respect to FIGS. 7A-7H is not required and the efficiency with which the TFT is fabricated may be improved. Moreover, the amorphous silicon layer 418 may be crystallized without having the gate electrode 428 formed thereon. Accordingly, the polycrystalline silicon layer 424 does not include a junction aligned with edges of the gate electrode 428, ensuring uniform crystallinity which improves electrical characteristics of the TFT "T." Because the dummy pattern, the polycrystalline silicon layer, the gate insulating layer, and the gate electrode are aligned using the same alignment keys as a reference, the gate electrode is precisely aligned over the channel region "IV" of the polycrystalline silicon layer 424 even though the TFT "T" is not of the aforementioned self-aligned type. Moreover, because the alignment keys 414 may be formed from the same material and layer as the color filter layer 412, additional processes related to the formation of the alignment keys 414 are eliminated.

Figure 9A:
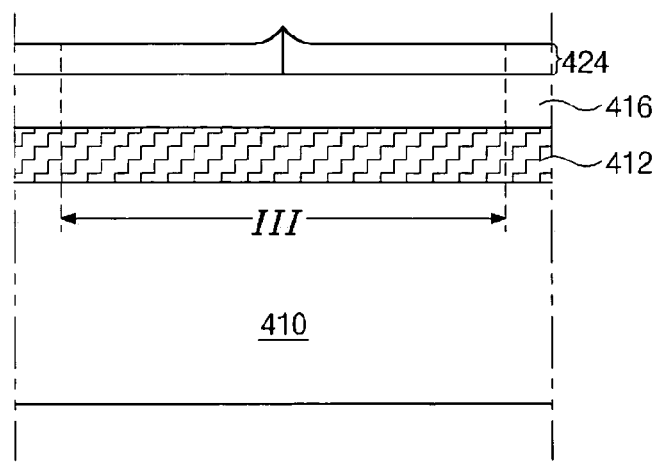
FIG. 9A illustrates a cross-sectional view showing crystallization state of a polycrystalline silicon layer according to the fourth embodiment of the present invention.
Figure 9B:
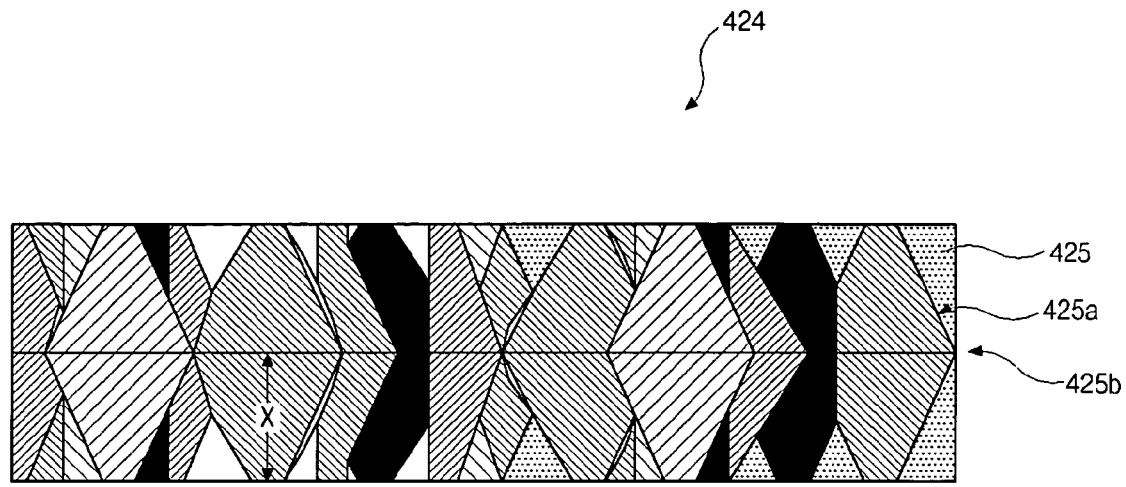
FIG. 9B illustrates a plan view showing crystallization state of a polycrystalline silicon layer according to the fourth embodiment of the present invention.

FIGS. 9A and 9B illustrate cross-sectional and plan views, respectively, of a crystallization state of a polycrystalline silicon layer according to the fourth embodiment of the present invention.

Referring to FIG. 9A, the color filter layer 412 is formed on substrate 410, the buffer layer 416 is formed on the color filter layer 412, and the polycrystalline silicon layer 424 is formed on the buffer layer 416 in the third region "III." According to principles of the present invention, the color filter layer 412 functions as a heat conservation layer with respect to the amorphous silicon layer 418 in that the portion of the color filter 412 arranged within the third region "III," below the buffer layer 412, thermally insulates the substrate 410 from heat stored within the amorphous silicon layer 418 as it is melted and re-solidified into the polycrystalline silicon layer 424. Such a provision of the color filter 412, therefore, ensures that a crystallinity within the resultant polycrystalline silicon film 424 will be substantially uniform.

Referring to FIG. 9B, the polycrystalline silicon layer 424 of the present invention may include a plurality of randomly oriented crystals (i.e., grains) 425. The surfaces that separate individual grains are called grain boundaries. Accordingly, FIG. 9B illustrates two general types of grain boundaries (i.e., a first grain boundary 425a and a second grain boundary 425b). As mentioned above, the polycrystalline silicon layer 424 is formed by irradiating amorphous silicon material with a laser beam to melt the silicon material and allowing the molten silicon material to re-solidify. As the molten silicon material cools, crystals begin to form randomly and independently of each other. As the cooling progresses, the crystals grow and form grains. The rate at which the molten silicon solidifies (i.e., the solidification rate) is a significant factor in determining the average size "X" of the grains. For example, as the solidification speed increases, the average size "X" decreases. Accordingly, to obtain large average grain sizes, the solidification rate must be decreased. When the color filter layer 412 (i.e., the heat conservation layer) is formed under the molten silicon material as it re-solidifies into the polycrystalline silicon layer 424, heat is prevented from quickly flowing out of the irradiated area into the substrate 410, thereby minimizing the solidification rate and ensuring a polycrystalline silicon layer 424 having a uniform crystallinity.

Figure 10:
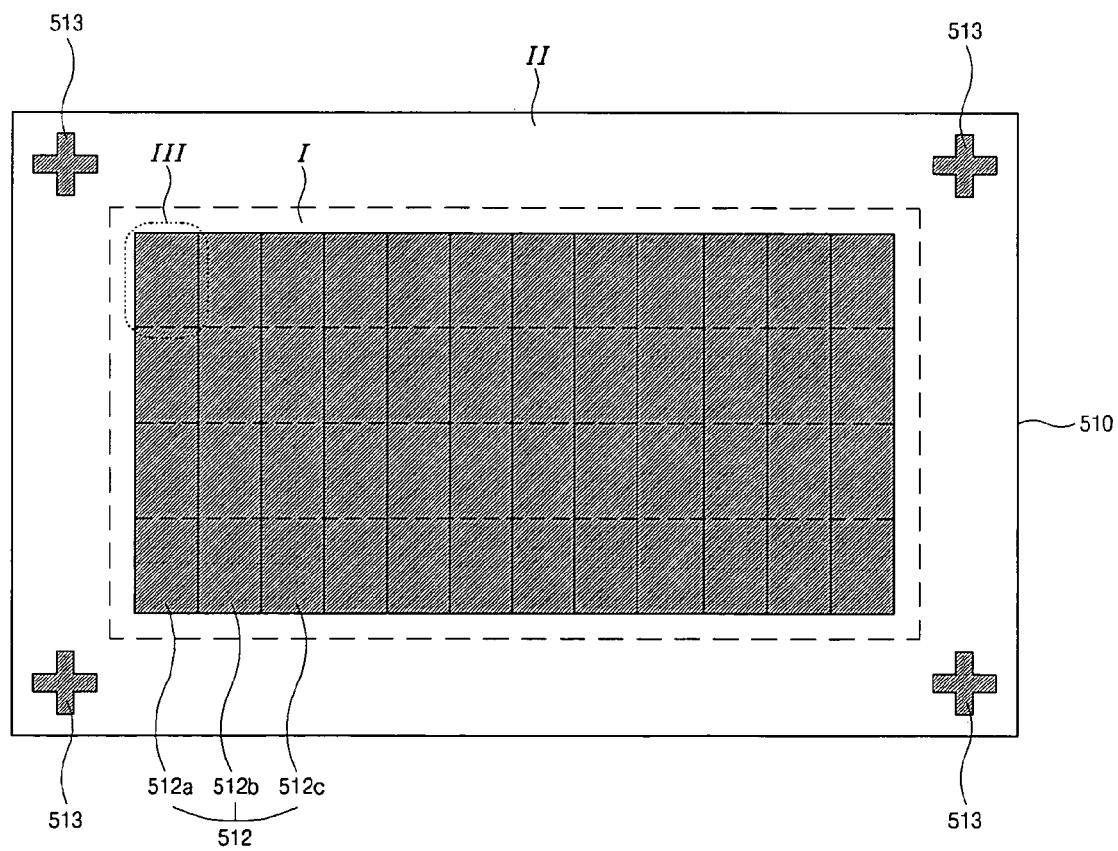
FIG. 10 illustrates a schematic plan view of an array substrate for an LCD device according to according to principles of the present invention.

FIG. 10 illustrates a schematic plan view of an array substrate for an LCD device according to according to principles of the present invention.

For purposes of discussion, it may be assumed that substrates, color filters, alignment keys, first regions, second regions, third regions, etc., discussed above with respect to the first through fourth embodiments correspond to equivalent structures and regions discussed below with respect to FIG. 10.

Referring to FIG. 10, a color filter layer 512 and alignment keys 513 are formed on a substrate 510 (e.g., an array substrate) having a first region "I" (i.e., a display region) and a second region "II" (i.e., a non-display region) that surrounds the first region "I." At least one third region "III" may be arranged within the first region "I." In one aspect of the present invention, the at least one third region "III" may correspond to a pixel region, in which a TFT such as those illustrated in the first to fourth embodiments, may be formed.

According to principles of the present invention, the color filter layer 512 may be formed in the first region "I" and the alignment keys 513 may be formed in the "II." In one aspect of the present invention, both the color filter layer 512 and the alignment keys 513 may be formed of a color resin material. In another aspect of the present invention, the color filter layer 512 and the alignment keys 513 may be formed simultaneously. In yet another aspect of the present invention, the color filter layer 512 and the alignment keys 513 may be formed from the same layer.

According to principles of the present invention, the color filter layer 512 may, for example, include red, green, and blue color sub-filters 512a, 512b, and 512c, respectively, wherein the red, green, and blue color sub-filters 512a-c are alternately arranged within the color filter layer 512. The alignment keys 513 may be arranged at edge portions of the substrate 510 (e.g., corner portions of the substrate 510). The alignment key 513 has one of a single layer and a multiple layer of red, green and blue sub-color filters 512a, 512b and 512c.

Figure 11:
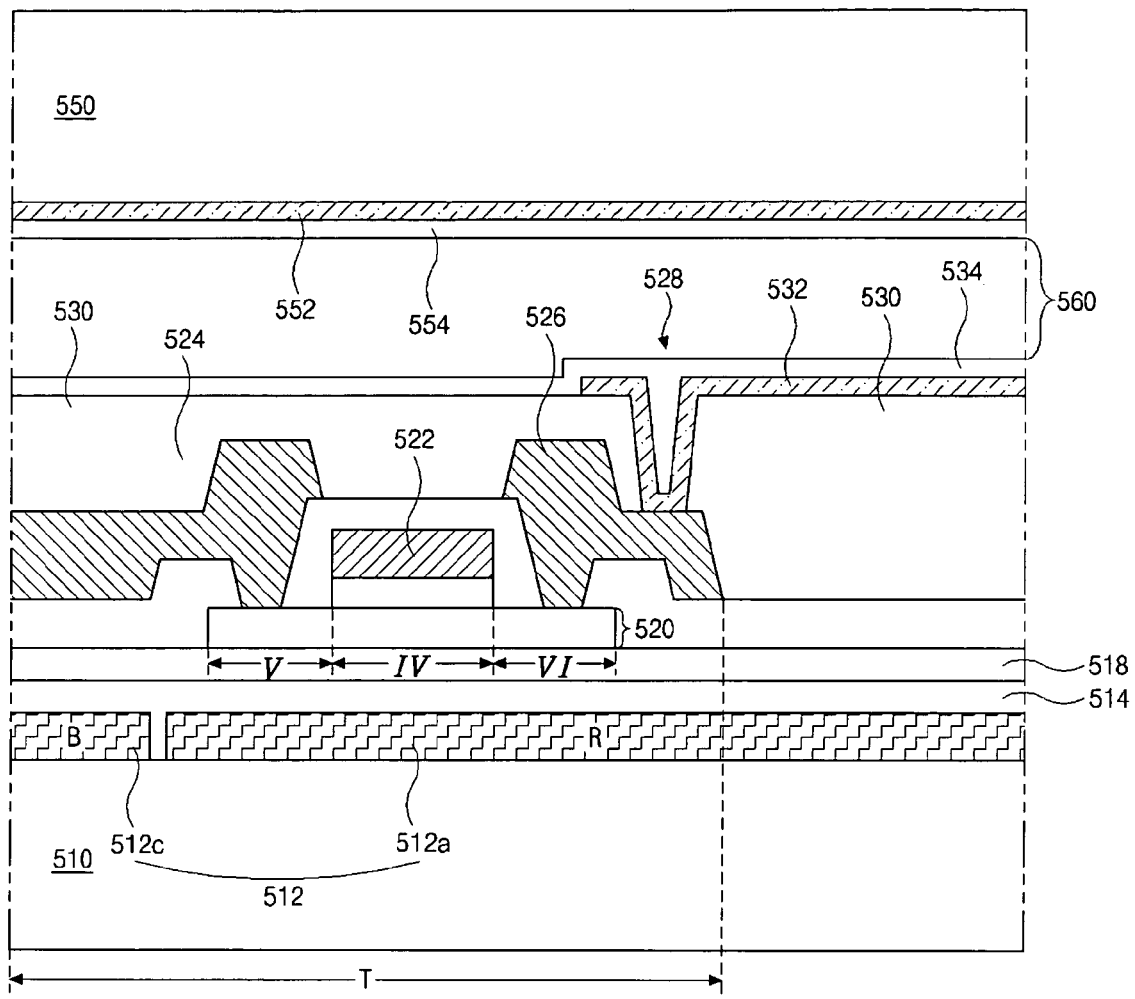
FIG. 11 illustrates a schematic cross-sectional view of an LCD device incorporating the array substrate shown in FIG. 10.

FIG. 11 illustrates a schematic cross-sectional view of an LCD device incorporating the array substrate shown in FIG. 10.

For purposes of discussion, it may be assumed that substrates, color filters, alignment keys, first regions, second regions, third regions, TFTs, etc., discussed above with respect to the first through fourth embodiments correspond to equivalent structures and regions discussed below with respect to FIG. 11.

Referring to FIG. 11, first and second substrates 510 and 550, respectively, are spaced apart from each other by a liquid crystal layer 560. A color filter layer 512 may be formed on an upper surface of the first substrate 510 (e.g., an array substrate) wherein the color filter includes alternately arranged red, green, and blue color sub-filters 512a and 512c (512b not shown for convenience of illustration). An optional planarization layer 514 may be formed on the color filter layer 512 to planarize the color filter layer 512, if desired. A buffer layer 518 may be formed over the planarization layer 514 and color filter layer and a thin film transistor (TFT) "T" may be formed on the buffer layer 518. In one aspect of the present invention, the TFT "T" may, for example, include a polycrystalline silicon layer 520, a gate electrode 522, a source electrode 524 and a drain electrode 526. A passivation layer 530 may be formed on the TFT "T" and be patterned by any suitable means to form a drain contact hole 528 exposing the drain electrode 526. A pixel electrode 532 may be formed on the passivation layer 530 and be electrically connected to the drain electrode 526 via the drain contact hole 528. A first orientation film 534 may be formed on the pixel electrode 532.

According to principles of the present invention, the polycrystalline silicon layer 520 may, for example, include a channel region "IV" defined by source and drain regions "V" and "VI" formed at opposing sides thereof. The source and drain regions "V" and "VI" may be doped with impurities in a doping process occurring before formation of the gate electrode 522. In one aspect of the present invention, the source and drain regions "V" and "VI" may be doped using alignment keys (not shown). In another aspect of the present invention, the alignment keys may be formed from the same material and layer as the color filter layer 512.

A common electrode 552 and a second orientation film may be sequentially formed on an surface of the second substrate 550 that faces the first substrate 510. Lastly, the liquid crystal layer 560 may be formed between the first and second orientation films 534 and 554.

As described above with respect to the principles of the present invention, an amorphous silicon layer may be selectively crystallized using alignment keys as a reference. As a result, a TFT fabrication efficiency may be improved, electrical characteristics of the TFT may be improved, and a grain boundary of crystallized regions of a polycrystalline silicon layer may be precisely and accurately positioned. The number of steps required to form alignment keys may be minimized by forming the alignment keys from the same material and layer as a color filter layer formed under a thin film transistor. Moreover, uniformity of a crystallinity within any polycrystalline silicon layer may be maximized because the color filter layer functions as a heat conservation layer. Further, the amorphous silicon layer may be crystallized after being doped. As a result, impurities may be activated simultaneously with the formation of the polycrystalline silicon layer. Still further, the amorphous silicon layer may be crystallized prior to a gate electrode being formed thereon. Accordingly, a polycrystalline silicon layer formed from the amorphous silicon layer does not include any junction aligned with edges of the gate electrode and, as a result, a uniform crystallinity of the polycrystalline silicon layer may be maximized to improve electrical characteristics of a subsequently formed TFT. Lastly, because the dummy pattern, polycrystalline silicon layer, gate insulating layer, and gate electrode are aligned using the same alignment keys as a reference, the gate electrode is precisely aligned over the channel region "IV" of the polycrystalline silicon layer 240 even though the TFT "T" is not of the self-aligned type.

It will be apparent to those skilled in the art that various modifications and variations can be made in a liquid crystal display device and a fabricating method thereof of the present invention without departing from the spirit or scope of the invention. Thus, it is intended that the present invention cover the modifications and variations of this invention provided they come within the scope of the appended claims and their equivalents.

What is claimed is:

1. A method of fabricating an array substrate for a liquid crystal display (LCD) device, comprising:
   forming at least an alignment key on a substrate, the substrate having a first region and a second region, wherein the alignment key is substantially located in the second region;
   forming an amorphous silicon layer on the alignment key;
   crystallizing a predetermined portion of the amorphous silicon layer using the alignment key as a reference;
   patterning the amorphous silicon layer using the alignment key as a reference to form a polycrystalline silicon layer, wherein the polycrystalline silicon layer is formed from the predetermined portion of the amorphous silicon layer;
   forming a gate insulating layer on the polycrystalline silicon layer;
   forming a gate electrode on the gate insulating layer using the alignment key as a reference;
   forming an interlayer insulating layer on the gate electrode; and
   forming source and drain electrodes on the interlayer insulating layer.

2. The method according to claim 1, wherein the crystallizing includes performing a sequential lateral solidification method.

3. The method according to claim 1, further comprising forming a buffer layer between the alignment key and the amorphous silicon layer.

4. The method according to claim 3, further comprising forming a color filter layer between the substrate and the buffer layer.

5. The method according to claim 4, wherein the alignment key is formed from the same material as the color filter layer.

6. The method according to claim 4, wherein the alignment key is formed from the same layer as the color filter layer.

7. The method according to claim 5, wherein the alignment key is formed in the non-display region.

8. The method according to claim 5, wherein the color filter layer is formed in the display region.

9. The method according to claim 4, wherein the color filter layer includes red, green and blue color sub-filters.

10. The method according to claim 4, wherein the color filter layer thermally insulates the substrate from the amorphous silicon layer.

11. The method according to claim 1, further comprising doping the polycrystalline silicon layer with impurities using the gate electrode as a doping mask.

12. The method according to claim 11, further comprising activating the semiconductor layer.

13. The method according to claim 12, wherein the activating includes performing a laser annealing method.

14. A method of fabricating a liquid crystal display (LCD) device, comprising:
   forming at least an alignment key on a first substrate, having a first region and a second region, wherein the alignment key is substantially located in the second region;
   forming an amorphous silicon layer on the alignment key;
   crystallizing a predetermined portion of the amorphous silicon layer using the alignment key as a reference;
   patterning the amorphous silicon layer using the alingment key as a reference to form a polycrystalline silicon layer, when the polycrystalline silicon layer is formed from the predetermined portion of the amorphous silicon layer;
   forming a gate insulating layer on the semiconductor layer;
   forming a gate electrode on the gate insulating layer using the alignment key as reference;
   forming an interlayer insulating layer on the gate electrode;
   forming source and drain electrodes on the interlayer insulating layer;
   forming a passivation layer on the source and drain electrodes;
   forming a pixel electrode on the passivation layer;
   forming a common electrode on a second substrate;
   attaching the first and second substrates such that the pixel electrode faces the common electrode; and
   forming a liquid crystal layer between the pixel elecrode and the common electrode.

15. The method according to claim 14, further comprising;
   forming a buffer later between the alignment key and the amorphous silicon layer; and
   forming a color filter layer between the substrate and the buffer layer,
   wherein the alignment key is formed of the same material as the color filter layer.

16. The method according to claim 15, wherein the alignment key is formed of the same layer as the color filter layer.

* * * * *